US010251238B2

(12) United States Patent
Wang et al.

(10) Patent No.: US 10,251,238 B2
(45) Date of Patent: Apr. 2, 2019

(54) ELECTROLUMINESCENT DEVICE AND METHOD OF FORMING THE SAME

(71) Applicant: NANYANG TECHNOLOGICAL UNIVERSITY, Singapore (SG)

(72) Inventors: Jiangxin Wang, Singapore (SG); Pooi See Lee, Singapore (SG); Guofa Cai, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 15/758,713

(22) PCT Filed: Sep. 9, 2016

(86) PCT No.: PCT/SG2016/050442
§ 371 (c)(1),
(2) Date: Mar. 8, 2018

(87) PCT Pub. No.: WO2017/044048
PCT Pub. Date: Mar. 16, 2017

(65) Prior Publication Data
US 2018/0249550 A1    Aug. 30, 2018

(30) Foreign Application Priority Data
Sep. 10, 2015  (SG) .............................. 10201507435S

(51) Int. Cl.
*H05B 33/26*  (2006.01)
*H01L 51/50*  (2006.01)
(Continued)

(52) U.S. Cl.
CPC ............ *H05B 33/26* (2013.01); *C09K 11/883* (2013.01); *C09K 11/885* (2013.01); *H01B 1/20* (2013.01);
(Continued)

(58) Field of Classification Search
CPC ........ H05B 33/26; H05B 33/28; H05B 33/10; H05B 33/06; H01L 51/0004–51/0005; H01L 51/56
See application file for complete search history.

(56) References Cited

U.S. PATENT DOCUMENTS

2006/0172448 A1 *  8/2006  Carter ................. H01L 51/0022
                                                             438/29
2010/0025703 A1 *  2/2010  Towns .................... C08L 65/00
                                                             257/98
(Continued)

FOREIGN PATENT DOCUMENTS

JP           57-43392 A        3/1982
JP     WO 2013089217 A1 *     6/2013  ............. C09K 11/06

OTHER PUBLICATIONS

Chen et al., "AC Powder Electroluminescence (ACPEL) and Devices," in Chen et al. (eds.), *Handbook of Visual Display Technology*, Springer-Verlag, Berlin, Germany, 2012, pp. 1193-1205.
(Continued)

*Primary Examiner* — Mariceli Santiago
(74) *Attorney, Agent, or Firm* — Seed IP Law Group LLP

(57) ABSTRACT

In various embodiments, a stretchable electroluminescent device may be provided. The electroluminescent device may include a first contact structure. The first contact structure may include an ionic conductor layer. The electroluminescent device may also include a second contact structure. The electroluminescent device may additionally include an emission layer between the first contact structure and the second contact structure. The emission layer may be configured to emit light when an alternating voltage is applied between the first contact structure and the second contact structure.

23 Claims, 27 Drawing Sheets

(51) Int. Cl.
  *H01L 51/52*   (2006.01)
  *H05B 33/10*   (2006.01)
  *H01B 1/20*    (2006.01)
  *H05B 33/14*   (2006.01)
  *C09K 11/88*   (2006.01)

(52) U.S. Cl.
  CPC ......... *H01L 51/5032* (2013.01); *H05B 33/10* (2013.01); *H05B 33/14* (2013.01); *H05B 33/145* (2013.01); *H01L 51/5052* (2013.01); *H01L 51/5076* (2013.01); *H01L 51/52* (2013.01); *H01L 2251/5338* (2013.01); *H01L 2251/564* (2013.01)

(56) References Cited

U.S. PATENT DOCUMENTS

| | | | | |
|---|---|---|---|---|
| 2010/0195337 A1* | 8/2010 | Heite | ............... | H05B 33/22 362/459 |
| 2011/0284825 A1* | 11/2011 | Yang | ............... | H01L 51/5048 257/40 |
| 2012/0043530 A1* | 2/2012 | Badre | ............... | H01B 1/122 257/40 |
| 2016/0233447 A1* | 8/2016 | Kim | ............... | A61B 5/6826 |
| 2018/0138430 A1* | 5/2018 | Chu | ............... | G02F 1/0147 |

OTHER PUBLICATIONS

Chen et al., "Highly Stretchable and Transparent Ionogels as Nonvolatile Conductors for Dielectric Elastomer Transducers," *ACS Appl. Mater. Interfaces* 6:7840-7845, 2014.

Chen et al., "High-performance transparent and stretchable all-solid supercapacitors based on highly aligned carbon nanotube sheets," *Scientific Reports* 4:3612, 2014. (7 pages).

Chen et al., "Stretchable and Transparent Hydrogels as Soft Conductors for Dielectric Elastomer Actuators," *Journal of Polymer Science, Part B: Polymer Physics* 52:1055-1060, 2014.

Cho et al., "Printable ion-gel gate dielectrics for low-voltage polymer thin-film transistors on plastic," *Nature Materials* 7:900-906, 2008.

Feng et al., "Flexible, Stretchable, Transparent Conducting Films Made from Superaligned Carbon Nanotubes," *Adv. Funct. Mater.* 20:885-891, 2010.

Filiatrault et al., "Stretchable Light-Emitting Electrochemical Cells Using an Elastomeric Emissive Material," *Adv. Mater.* 24:2673-2678, 2012.

Frutiger et al., "Capacitive Soft Strain Sensors via Multicore-Shell Fiber Printing," *Adv. Mater.* 27:2440-2446, 2015.

Haranath et al., "Chapter 1: Electroluminescence: an introduction," in Vij (ed.), *Handbook of Electroluminescent Materials*, Institute of Physics Publishing, London, England, 2004, 23 pages.

Howard et al., "A simple model for the hysteretic behavior of ZnS:Mn thin film electroluminescent devices," *Journal of Applied Physics* 53(1):639-647, 1982.

Hu et al., "Highly stretchable, conductive, and transparent nanotube thin films," *Appl. Phys. Lett.* 94:161108, 2009. (3 pages).

Hu et al., "Intrinsically stretchable transparent electrodes based on silver-nanowire—crosslinked-polyacrylate composites," *Nanotechnology* 23:344002, 2012. (9 pages).

Hu et al., "Stretchable Inorganic-Semiconductor Electronic Systems," *Adv. Mater.* 23:2933-2936, 2011.

Keplinger et al., "Stretchable, Transparent, Ionic Conductors," *Science* 341(6149):984-987, 2013.

Kim et al., "Stretchable and transparent electrodes based on in-plane structures," *Nanoscale* 7:14577-14594, 2015.

Kim et al., "Waterproof AlInGaP optoelectronics on stretchable substrates with applications in biomedicine and robotics," *Nature Materials* 9:929-937, 2010.

Lee et al., "Cut and Stick Rubbery Ion Gels as High Capacitance Gate Dielectrics," *Adv. Mater.* 24:4457-4462, 2012.

Liang et al., "Elastomeric polymer light-emitting devices and displays," *Nature Photonics* 7:817-824, 2013.

Liang et al., "Silver Nanowire Percolation Network Soldered with Graphene Oxide at Room Temperature and Its Application for Fully Stretchable Polymer Light-Emitting Diodes," *ACS Nano* 8(2):1590-1600, 2014.

Park et al., "Printed Assemblies of Inorganic Light-Emitting Diodes for Deformable and Semitransparent Displays," *Science* 325(5943):977-981, 2009.

Rogers et al., "Materials and Mechanics for Stretchable Electronics," *Science* 327(5973):1603-1607, 2010.

Singh et al., "Phosphor currents in ZnS:Mn ac thin film electroluminescent display devices," *Journal of Applied Physics* 72(9):4148-4155, 1992.

Sun et al., "Ionic Skin," *Adv. Mater.* 26:7608-7614, 2014.

Sun et al., "Polycarbonate-based solid polymer electrolytes for Li-ion batteries," *Solid State Ionics* 262:738-742, 2014.

Wang et al., "High-efficiency transfer of percolating nanowire films for stretchable and transparent photodetectors," *Nanoscale* 6:10734-10739, 2014.

Wang et al., "Highly Stretchable and Self-Deformable Alternating Current Electroluminescent Devices," *Advanced Materials* 27(18):2876-2882, 2015.

White et al., "Ultrathin, highly flexible and stretchable PLEDs," *Nature Photonics* 7:811-816, 2013.

Winscom et al., "Equivalent Circuits and Efficacy of Single-Layer ACPEL Devices," *ECS Journal of Solid State Science and Technology* 3(6):R104-R108, 2014.

Yu et al., "Intrinsically Stretchable Polymer Light-Emitting Devices Using Carbon Nanotube-Polymer Composite Electrodes," *Adv. Mater.* 23:3989-3994, 2011.

Zeng et al., "A New Transparent Conductor: Silver Nanowire Film Buried at the Surface of a Transparent Polymer," *Adv. Mater.* 22:4484-4488, 2010.

* cited by examiner

850

860

870

ELECTROLUMINESCENT DEVICE AND METHOD OF FORMING THE SAME

CROSS-REFERENCE TO RELATED APPLICATION

This application claims the benefit of priority of Singapore patent application No. 10201507435S, filed 10 Sep. 2015, the content of it being hereby incorporated by reference in its entirety for all purposes.

TECHNICAL FIELD

Various embodiments relate to electroluminescent devices and methods of forming the same.

BACKGROUND

Stretchable electronics have emerged as a new type of devices having better mechanical compliance compared to their rigid or flexible counterparts. They may be able to tolerate demanding mechanical deformations such as stretching, flexing, twisting, folding, or conformably wrapping, which make them suitable for electronic applications requiring rigorous mechanical conditions that cannot be addressed by the use of conventional electronic devices. Such stretchable electronic devices may be also referred to as "soft" electronics.

An interesting type of soft electronics which seems to have spurred significant interest is the stretchable electroluminescent (EL) device. The EL device may become an essential technology in future lighting and display applications. The soft physical form or stretchable property may render such devices to be suitable for unprecedented applications, such as biomedical related applications that involve implantable devices on curvilinear tissue surfaces, three-dimensional displays that render contents physically, or visual systems which provide users with tactile interaction besides visual information etc. Particularly, stretchable conductors may play an important role in the construction of deformable EL devices that may be used for such applications.

In order to fabricate stretchable electrodes, two different strategies have been developed. The first strategy focuses on stretchable structures while the second focuses on stretchable materials. However, due to intractable material challenges faced when developing electronic conductors, efforts have been mainly geared towards developing conductors with stretchable structures for deformable EL devices. For example, thin metal films have been conventionally patterned into stretchable structures for use as electrical interconnects to assemble rigid light-emitting elements on elastic substrates. Conventional technologies may also be combined with this approach to derive stretchable electronics. However, this may be impeded by challenges such as a need for large-scale and cost-effective techniques to be developed so as to manipulate the stretchable structures, and a requirement to assemble components with significant mechanical incompatibilities to form durable deformable devices. Furthermore, since the metal films may be opaque, the developed electrodes may be unsuitable for use as stretchable EL devices which require good transmittance for efficient light extraction.

Recently, carbon nanotubes (CNTs) and silver nanowires (AgNWs) have been used as highly conductive fillers in polymer matrix for forming transparent and stretchable electrodes with their percolating network structure. When combined with stretchable emissive layers, the transparent and stretchable electrodes may be used to form fully stretchable EL devices. Although stretchable devices at moderate strains may be achieved in this manner, it remains challenging to improve the stretching strains of these thin and transparent nanowire networks beyond 100% due to the damage on the network structure when subjected to large mechanical deformations. Due to this stretchability limitation in conventional transparent electronic conductors, alternating-current electroluminescent (ACEL) devices derived through the above means may only sustain a strain of 100% before deteriorating.

SUMMARY

In various embodiments, an electroluminescent device may be provided. The electroluminescent device may include a first contact structure. The first contact structure may include an ionic conductor layer. The electroluminescent device may also include a second contact structure. The electroluminescent device may additionally include an emission layer between the first contact structure and the second contact structure. The emission layer may be configured to emit light when an alternating voltage is applied between the first contact structure and the second contact structure.

In various embodiments, a method of forming an electroluminescent device may be provided. The method may include forming a first contact structure, the first contact structure including an ionic conductor layer. The method may also include forming a second contact structure. The method may further include forming an emission layer between the first contact structure and the second contact structure. The emission layer may be configured to emit light when an alternating voltage is applied between the first contact structure and the second contact structure.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 8C shows a photo showing the array in operation with one of the devices according to various embodiments being turned on.

FIG. 8D shows a photo showing the array in operation with another one of the devices 800 according to various embodiments being turned on.

FIG. 8E shows a photo showing the array in operation with two of the devices according to various embodiments being turned on.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Various embodiments may provide an electroluminescent device that remove or mitigate one or more disadvantages in conventional devices as mentioned above. Various embodiments may provide a method of forming the same. Various embodiments may provide a device with improved stretchability/deformability, mechanical stability, and/or transmittance/transparency, while retaining good electrical properties. Various embodiments may be able to repeatedly withstand harsh mechanical conditions in various applications without deterioration of electrical properties.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 1:
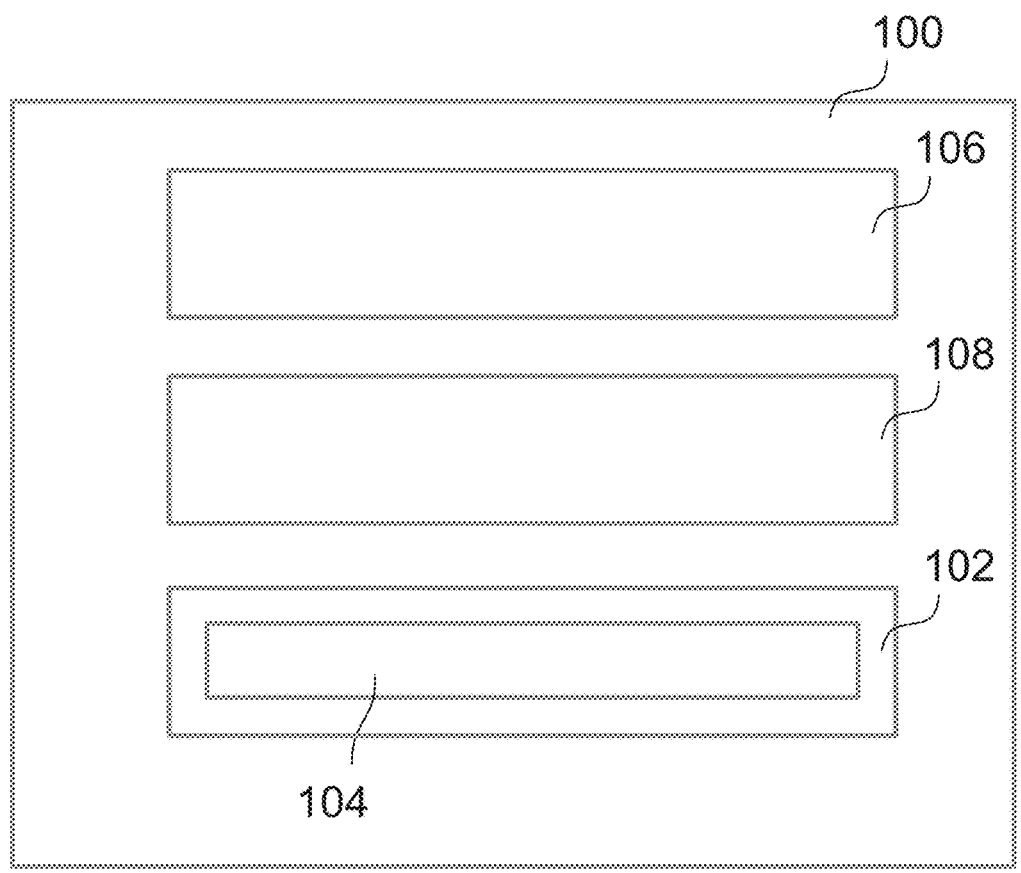
FIG. 1 is a schematic illustrating an electroluminescent device according to various embodiments.

FIG. 1 is a schematic illustrating an electroluminescent device 100 according to various embodiments. The electroluminescent device 100 may include a first contact structure 102. The first contact structure 102 may include an ionic conductor layer 104. The electroluminescent device 100 may also include a second contact structure 106. The electroluminescent device 100 may additionally include an emission layer 108 between the first contact structure 102 and the second contact structure 106. The emission layer 108 may be configured to emit light when an alternating voltage is applied between the first contact structure 102 and the second contact structure 106.

In other words, the electroluminescent device 100 may include an emission layer 108. The device 100 may include a first contact structure 102 over a first surface of the emission layer, and a second contact structure 106 over a second surface of the emission layer opposing the first surface. The first contact structure 102 may include an ionic conductor layer 104. When an alternating voltage is applied at the first contact structure 102 relative to the second contact structure 106, optical light is emitted by the emission layer 108.

FIG. 1 is a general schematic showing the features of a device 100 according to various embodiments, and should not be interpreted in a limiting sense. In particular, FIG. 1 does not limit the layout or arrangement of the various features, as well as the order in which the various features are formed. For instance, in various embodiments, the first contact structure 102 may be above the emission layer 108, and the emission layer 108 may be over the second contact structure 106.

The alternating voltage may be referred to as an alternating current (AC) voltage or an alternating current (AC) potential difference. The alternating voltage may be a sinusodal voltage signal.

The optical light may be visible light. In various embodiments, the second contact structure may be at 0 V (ground), and the first contact structure may be at the alternating voltage.

The ionic conductor layer 104 may allow for improved stretchability and/or improved deformability. The ionic conductor layer 104 may allow light emitted by the emission layer 108 to pass through.

In various embodiments, the first contact structure 102 may be in contact with the emission layer 108, i.e. on a first surface of the emission layer 108. The second contact structure 106 may be in contact with the emission layer 108, i.e. on a second surface of the emission layer 108.

The first contact structure 102 may further include an electrode. The electrode may include an electrically conductive material, such as copper or graphite. The electrode (of the first contact structure 102) may be in contact with the ionic conductor layer 104. The ionic conductor layer 104 may be between the electrode (of the first contact structure 102) and the emission layer 108.

The electrode (of the first contact structure 102) and the ionic conductor layer 104 may form an interface, which may have a capacitive value higher than a capacitive value of the emission layer 108. A first capacitor is formed by the electrical double layers at the interface of the ionic conductor layer 104 and the electrode, while a second capacitor is formed at the emission layer 108, wherein the second capacitor is connected in series to the first capacitor. As the first capacitor has a small charge separation (e.g. in the range of a few nanometers), the first capacitor may have a large capacitive value (e.g. in the order of about $10^{-1}$ F/m$^2$). On the other hand, as the second capacitor has a larger charge separation (e.g. in the range of 200 μm), the second capacitor may have a smaller capacitive value (e.g. in the order of about $10^{-7}$ F/m$^2$). Accordingly, when an external alternating voltage is applied to the electroluminescent device, the potential difference applied across the emission layer 108 may be greater than the potential difference applied across the electrical double layers at the interface of the ionic conductor layer 104 and the electrode of the first contact structure 102.

The ionic conductor layer 104 may include an ionic entity and a polymer host. The ionic entity may be dispersed in the polymer host.

The ionic entity may be an ionic salt or ionic liquid. The ionic salt may be an alkali salt selected from, but is not limited to, a group consisting of lithium iodide (LiI), sodium iodide (NaI), potassium iodide (KI), lithium chloride (LiCl), sodium chloride (NaCl), potassium chloride (KCl), lithium perchlorate (LiClO$_4$), sodium perchlorate (NaClO$_4$), and potassium perchlorate (KClO$_4$). The ionic liquid may have a cation selected from, but is not limited to, a group consisting of imidazolium, pyridinium, alkylammonium, alkylphosphonium, pyrrolidinium, guanidinium, and alkylpyrrolidinium. The polymer host may be selected from, but is not limited to, a group consisting of poly(ethylene oxide) (PEO), poly(propylene oxide) (PPO), poly(acrylonitrile) (PAN), poly(methyl methacrylate) (PMMA), poly(vinyl chloride) (PVC), poly(vinylidene fluoride) (PVDF), poly (acrylic acid) (PAA), and any combination thereof.

In various embodiments, the second contact structure 106 may include or consist of an electrode. The electrode may include an electrically conductive material, such as metallic inks including but not limited to silver ink, copper ink, nick ink and gold ink, metal oxide inks including but not limited to indium tin oxide ink and aluminum-doped zinc oxide, and carbon based inks including but not limited to carbon powder ink, carbon nanotube ink, and graphite inks. The electroluminescent device 100 may include the electrode of the second contact structure 106, the emission layer 108 on or over the electrode of the second contact structure 106, and the ionic conductor layer 104 on or over the emission layer. The device 100 may further include an electrode of the first conductor structure 102 on or over the ionic conductor layer 104.

In various alternate embodiments, the second contact structure 106 may include a further ionic conductor layer. The second contact structure 106 may also include an electrode in contact with the further ionic conductor layer. The further ionic conductor layer may be between the electrode (of the second contact structure 106) and the emission layer 108.

The electroluminescent device 100 may include the electrode of the first contact structure 102, the ionic conductor layer 104 on or over the electrode of the first contact structure 102, the emission layer 108 on or over the ionic conductor layer 104, the further ionic conductor layer on or over the emission layer 108, and an electrode of the second conductor structure 106 on or over the further ionic conductor layer.

The electrode (of the second contact structure 106) and the further ionic conductor layer may form an interface, which may have a capacitive value higher than a capacitive value of the emission layer 108. A third capacitor is formed by the electrical double layers at the interface of the further ionic conductor layer and the electrode (of the second contact structure 106). The third capacitor may be connected in series with the second capacitor formed by the emission layer 108, as well as the first capacitor formed by an interface between the electrode of the first conductor structure 102 and the ionic conductor layer 104. As the third capacitor has a small charge separation (e.g. in the range of a few nanometers), the third capacitor may have a large capacitive value (e.g. in the order of about $10^{-1}$ F/m$^2$). On the other hand, as the second capacitor has a larger charge separation (e.g. in the range of 200 μm), the second capacitor may have a smaller capacitive value (e.g. in the order of about $10^{-7}$ F/m$^2$). Accordingly, when an external alternating voltage is applied to the electroluminescent device, the potential difference applied across the emission layer may be larger than the potential difference applied across the electrical double layers at the interface of the further ionic conductor layer and the electrode (of the second contact structure 106).

In various embodiments, the second capacitor has a capacitance value smaller than a capacitive value of the first capacitor, and smaller than a capacitive value of the third capacitor. Accordingly, when an external alternating voltage is applied to the electroluminescent device 100, the potential difference applied across the emission layer 108 is greater than the potential difference applied across the electrical double layers at the interface of the ionic conductor layer 104 and the electrode of the first contact structure 102, as well as the potential difference applied across the electrical double layers at the interface of the further ionic conductor layer and the electrode of the second contact structure 106.

The further ionic conductor layer may include an ionic entity and a polymer host. The ionic entity may be dispersed in the polymer host.

The ionic entity may be an ionic salt or ionic liquid. The ionic salt may be an alkali salt selected from, but is not limited to, a group consisting of LiI, NaI, KI, LiCl, NaCl, KCl, LiClO$_4$, NaClO$_4$, and KClO$_4$. The ionic liquid may have a cation selected from, but is not limited to, a group consisting of imidazolium, pyridinium, alkylammonium, alkylphosphonium, pyrrolidinium, guanidinium, and alkylpyrrolidinium. The polymer host may be selected from, but is not limited to, a group consisting of poly(ethylene oxide) (PEO), poly(propylene oxide) (PPO), poly(acrylonitrile) (PAN), poly(methyl methacrylate) (PMMA), poly(vinyl chloride) (PVC), poly(vinylidene fluoride) (PVDF), poly (acrylic acid) (PAA), and any combination thereof.

In various embodiments, the emission layer 108 may include one or more electroluminescent elements configured to emit said light.

In various embodiments, the one or more electroluminescent elements may be inorganic compounds. The inorganic compounds may be selected from, but is not limited to, a group consisting of zinc sulphide (ZnS), cadmium sulphide (CdS), calcium sulphide (CaS), strontium sulphide (SrS), cadmium selenide (CdSe), and any combination thereof. The inorganic compounds may be doped with one or more dopants selected from, but is not limited to, a group consisting of magnesium, cobalt, silver, aluminium, copper, and cadmium. The doping concentration may be selected from a range of about 0.01 molar percentage (mol %) to about 0.1 molar percentage (mol %). The one or more electroluminescent elements may be or may include nanostructures such as a quantum dots, nanowires etc.

In various other embodiments, the one or more electroluminescent elements may be electroluminescent conjugated polymers. The electroluminescent conjugated polymers may be selected from, but is not limited to, a group consisting of poly(p-phenylene vinylene) (PPV), a derivative of poly(p-phenylene vinylene), poly(9,9-di-n-octylfluorenyl-2,7-diyl) (PFO), a derivative of poly(9,9-di-n-octylfluorenyl-2,7-diyl), poly(N-vinylcarbazole) (PZO), a derivative of poly (N-vinylcarbazole), poly(p-phenylene) (PPP) and a derivative of poly(p-phenylene). A derivative as referred herein may refer to a composite, such as an organic-inorganic composite. The one or more electroluminescent elements may be composites, such as an organic-inorganic composites.

In various other embodiments, the one or more electroluminescent elements may be ionic transition metal complexes.

In various embodiments, the emission layer 108 may further include a elastomer. The one or more electroluminescent elements may be embedded or dispersed in the elastomer. The elastomer may be selected from, but is not limited to, a group consisting of a polysiloxane, a polyepoxide, a polysulfide rubber, a polyurethane, a polyacrylic, a silicone, and any combination thereof. The one or more electroluminescent elements and the elastomer may form a composite. In other words, the emission layer 108 may include a composite of the one or more electroluminescent elements, and the elastomer. In various embodiments, the elastomer may be polydimethylsiloxane (PDMS).

In various embodiments, the ionic conductor layer 104 and/or the further ionic conductor layer may be configured to at least partially allow light emitted by the emission layer to pass through. The ionic conductor layer 104 and/or the further ionic conductor layer may be transparent or translucent.

In various embodiments, the ionic conductor layer 104 may cover or overlap with the entire first surface of the emission layer 108. In various embodiments, the further ionic conductor layer may cover or overlap with the entire second surface of the emission layer 108. The emission layer 108 may cover or overlap the ionic conductor layer 104, or/and may cover or overlap the further ionic conductor layer, so as to prevent the direct contact between the ionic conductor layer 104 and the further ionic conductor layer. When the emission layer 108 is stretched or deformed, the ionic conductor layer 104 and/or the further ionic conductor layer may be stretched or deformed with the emission layer 108, while still transmitting AC potential difference voltages to the emission layer 108 for emission of light.

In various embodiments, the electroluminescent device 100 may be a printed device. The ionic conductor layer 104 and/or the further ionic conductor layer may be printed, including 2D and 3D printing.

In various embodiments, a dimension of the electroluminescent device 100, such as a length of the device 100, may be stretched, i.e. is stretchable, beyond 100%, or beyond 200%, or beyond 500%, or beyond 600%, or beyond 700% of an original dimension of the electroluminescent device 100, without affecting the operation of the device 100. In other words, a percentage of a stretched dimension to an original dimension of the electroluminescent device 100 (which may be referred to as the stretching strain) may be beyond 100%, or beyond 200%, or beyond 500%, or beyond 600%, or beyond 700%. In various embodiments, a dimension of the electroluminescent device 100 may be stretched, i.e. is stretchable, up to a limit of 700% of the original dimension of the electroluminescent device 100. The emission layer 108 may be still able to emit light when the device 100 is at the stretched dimension, upon applying an alternating voltage between the first contact structure 102 and the second contact structure 106.

The emission layer 108 may alternatively be referred to as the emissive layer.

Figure 2:
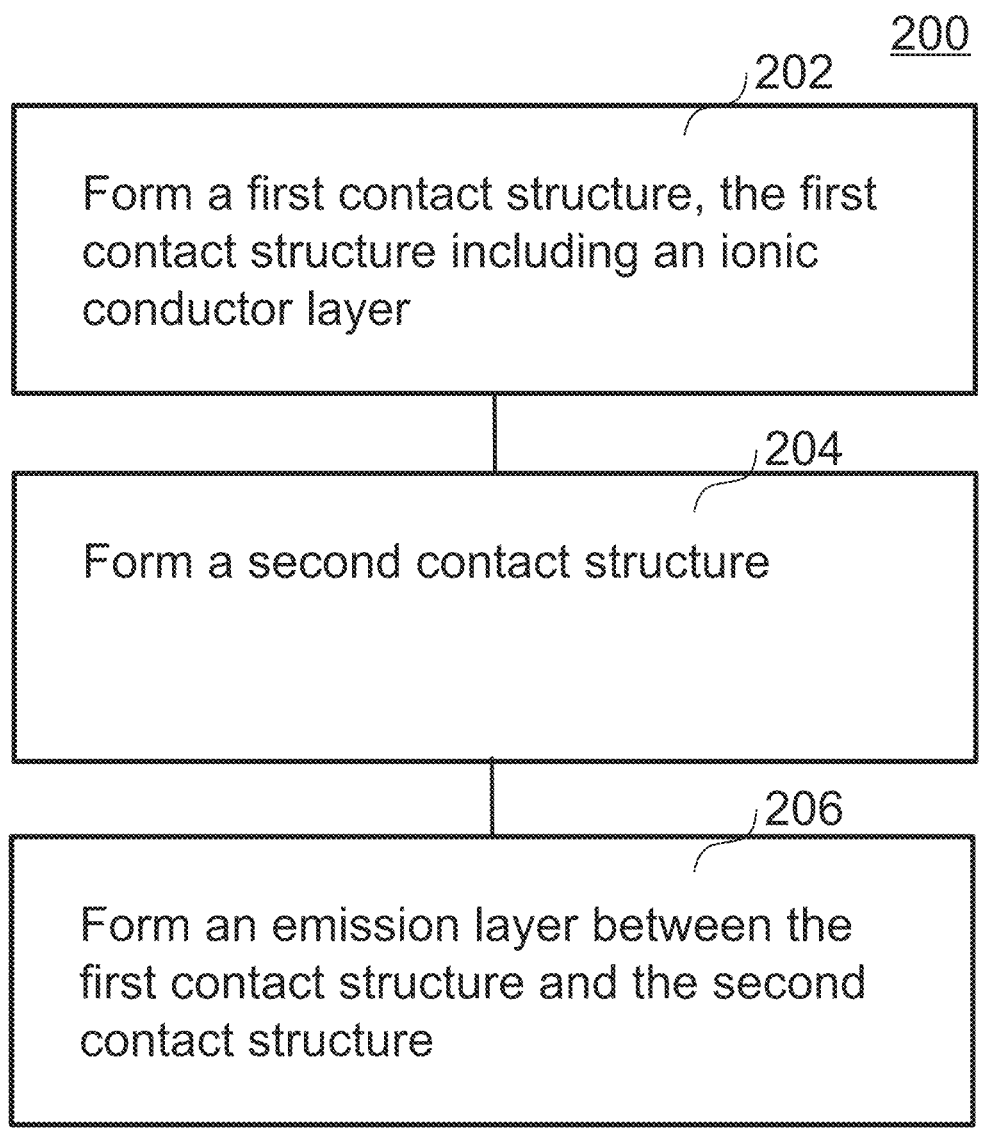
FIG. 2 is a schematic illustrating a method of forming an electroluminescent device according to various embodiments.

FIG. 2 is a schematic 200 illustrating a method of forming an electroluminescent device according to various embodiments. The method may include, in 202, forming a first contact structure, the first contact structure including an ionic conductor layer. The method may also include, in 204, forming a second contact structure. The method may further include, in 206, forming an emission layer between the first contact structure and the second contact structure. The emission layer may be configured to emit light when an alternating voltage is applied between the first contact structure and the second contact structure.

In other words, the method may include forming the first contact structure, the second contact structure, and the emission layer between the first contact structure and the second contact structure. The first contact structure may include an ionic conductor layer. When an alternating voltage is applied between the first contact structure and the second contact structure, light is emitted by the emission layer between the first contact structure and the second contact structure.

While the method described in FIG. 2 is illustrated and described as a series of steps, it will be appreciated that any ordering of such steps are not to be interpreted in a limiting sense. In other words, the steps may not necessarily be in sequence. For example, step 206 (i.e. forming the emission layer) may occur before step 204 (i.e. forming the second contact structure), or/and step 206 may occur before step 202. Further, two or more steps may occur simultaneously.

The ionic conductor layer may be formed before forming the emission layer on the ionic conductor layer. The method may further include forming a further ionic conductor layer on the emission layer.

In various embodiments, the device may include an emission layer between an ionic conductor layer, and a further ionic conductor layer. The ionic conductor layer may be formed by depositing or applying an ionic conductor solution on a substrate, such as a 3M VHB tape, and further drying the deposited or applied ionic conductor solution. The ionic conductor solution may be deposited or applied by a suitable technique such as doctor blade coating, slot die coating, spray coating, ink-jet printing, 3D printing or a layer-by-layer technique, but not limited to these mentioned. The ionic conductor solution may include an ionic entity, a polymer host, and an organic solvent. The ionic conductor solution may be dried in an oven to form the ionic conductor layer. When the ionic conductor solution is dried, the organic solution may be substantially evaporated to form a solid ionic conductor layer including the ionic entity and the polymer host. The organic solvent may be selected from, but is not limited to, a group consisting of dimethyl carbonate (DMC), diethyl carbonate (DEC), c-butyrolactone (BL), propylene carbonate (PC), ethylene carbonate (EC), acetonitrile, and any combination thereof. In various embodiments, the thickness of the ionic conductor layer may be any value between about 1 μm to about 500 μm. For instance, the thickness of an ionic conductor layer formed by doctor blade coating may be any value between about 50 μm to about 500 μm, and the thickness of an ionic conductor layer formed by the layer-by-layer technique may be any value between about 1 μm to about 10 μm.

The emission layer may be formed on the ionic conductor layer after forming the ionic conductor layer. The emission layer may be formed by depositing or applying the emission layer material, e.g. a mixture of one or more electroluminescent elements and an elastomer precursor solution, on the ionic conductor layer, and curing the emission layer material. The emission layer material may be deposited or applied using a suitable technique, such as doctor blade coating. The weight ratio of the one or more electroluminescent elements to the elastomer precursor solution may range from between 1:2 to about 3:1. The curing may be carried out at about room temperature for about 2 hours. After curing, the mixture of the one or more electroluminescent elements and the elastomer precursor solution may form a composite including the one or more electroluminescent elements and the elastomer. The thickness of the emission layer may be controlled to any value between about 50 μm to about 500 μm.

In various embodiments, the further ionic conductor layer may be formed by depositing or applying a further ionic conductor solution on the emission layer after forming the emission layer. The ionic conductor solution and the further ionic conductor solution may be the same or may be different. The ionic entity, the polymer host and/or the organic solution present in the ionic conductor solution may be the same or may be different to the ionic entity, the polymer host and/or the organic solution present in the further ionic conductor solution. The further ionic conductor solution may include an ionic entity, a polymer host, and an organic solvent. The further ionic conductor solution may be dried in an oven to form the further ionic conductor layer. When the further ionic conductor solution is dried, the organic solution may be substantially evaporated to form the solid further ionic conductor layer including the ionic entity and the polymer host. The organic solvent may be selected from, but is not limited to, a group consisting of dimethyl carbonate (DMC), diethyl carbonate (DEC), c-butyrolactone (BL), propylene carbonate (PC), ethylene carbonate (EC), acetonitrile, and any combination thereof. In various embodiments, the thickness of the further ionic conductor layer may be any value between about 1 μm to about 500 μm. For instance, the thickness of a further ionic conductor layer formed by doctor blade coating may be any value between about 50 μm to about 500 μm, and the thickness of a further ionic conductor layer formed by the layer-by-layer technique may be any value between about 1 μm to about 10 μm.

The method may also include forming a first electrode, i.e. the electrode of the first contact structure, wherein the first electrode is in contact with the ionic conductor layer. The method may also include forming a second electrode, i.e. the electrode of the second contact structure, wherein the second electrode is in contact with the further ionic conductor layer. The first electrode may be formed by connecting an electrical conductor, such as a copper tape or a graphite paper, to the ionic conductor layer. The first electrode may be provided on the substrate before depositing or applying the ionic conductor solution on the substrate to form the ionic conductor layer, so that the first electrode is adhered to or is in contact with the ionic conductor layer when the ionic conductor layer is formed. The second electrode may be formed by connecting an electrical conductor, such as a copper tape or a graphite paper, to the further ionic conductor layer. The second electrode may be formed after forming the further ionic conductor layer.

In various other embodiments, the device may include an emission layer between an ionic conductor layer, and an electrode including an electrode material such as silver ink. In various embodiments, an electrode material, such as silver ink, may be applied or deposited on a substrate to form the electrode. The method may further include drying the electrode material to form the electrode.

The method may further include forming the emission layer on the electrode after the electrode is formed. The emission layer may be formed by depositing or applying the emission layer material, e.g. a mixture of one or more electroluminescent elements and an elastomer precursor solution, on the electrode, and curing the emission layer material. The emission layer material may be deposited or applied using a suitable technique, such as doctor blade coating. The weight ratio of the one or more electroluminescent elements to the elastomer precursor solution may range from between 1:2 to about 3:1. The curing may be carried out at about room temperature for about 2 hours. After curing, the mixture of the one or more electroluminescent elements and the elastomer precursor solution may form a composite including the one or more electroluminescent elements and the elastomer. The thickness of the emission layer may be controlled to any value between about 50 µm to about 500 µm.

The method may further include forming the ionic conductor layer on the emission layer after forming the emission layer. The ionic conductor layer may be formed by depositing or applying an ionic conductor solution on the emission layer. The ionic conductor solution may be deposited or applied by a suitable technique such as doctor blade coating, or a layer-by-layer technique. The ionic conductor solution may include an ionic entity, a polymer host, and an organic solvent. The organic solvent may be selected from, but is not limited to, a group consisting of dimethyl carbonate (DMC), diethyl carbonate (DEC), c-butyrolactone (BL), propylene carbonate (PC), ethylene carbonate (EC), acetonitrile, and any combination thereof. In various embodiments, the thickness of the ionic conductor layer may be any value between about 1 µm to about 500 µm. For instance, the thickness of an ionic conductor layer formed by doctor blade coating may be any value between about 50 µm to about 500 µm, and the thickness of an ionic conductor layer formed by the layer-by-layer technique may be any value between about 1 µm to about 10 µm. A further electrode may be formed on the ionic conductor layer.

It may also be envisioned that the ionic conductor layer may instead be formed first, followed by forming the emission layer on the ionic conductor layer, and forming the electrode on the emission layer after the emission layer is formed. In various embodiments, the first contact structure, the second contact structure, and the emission layer may be formed at least partially by three-dimensional (3D) printing. For instance, the ionic conductor layer and/or the further ionic conductor layer may be formed by 3D printing.

Figure 3:
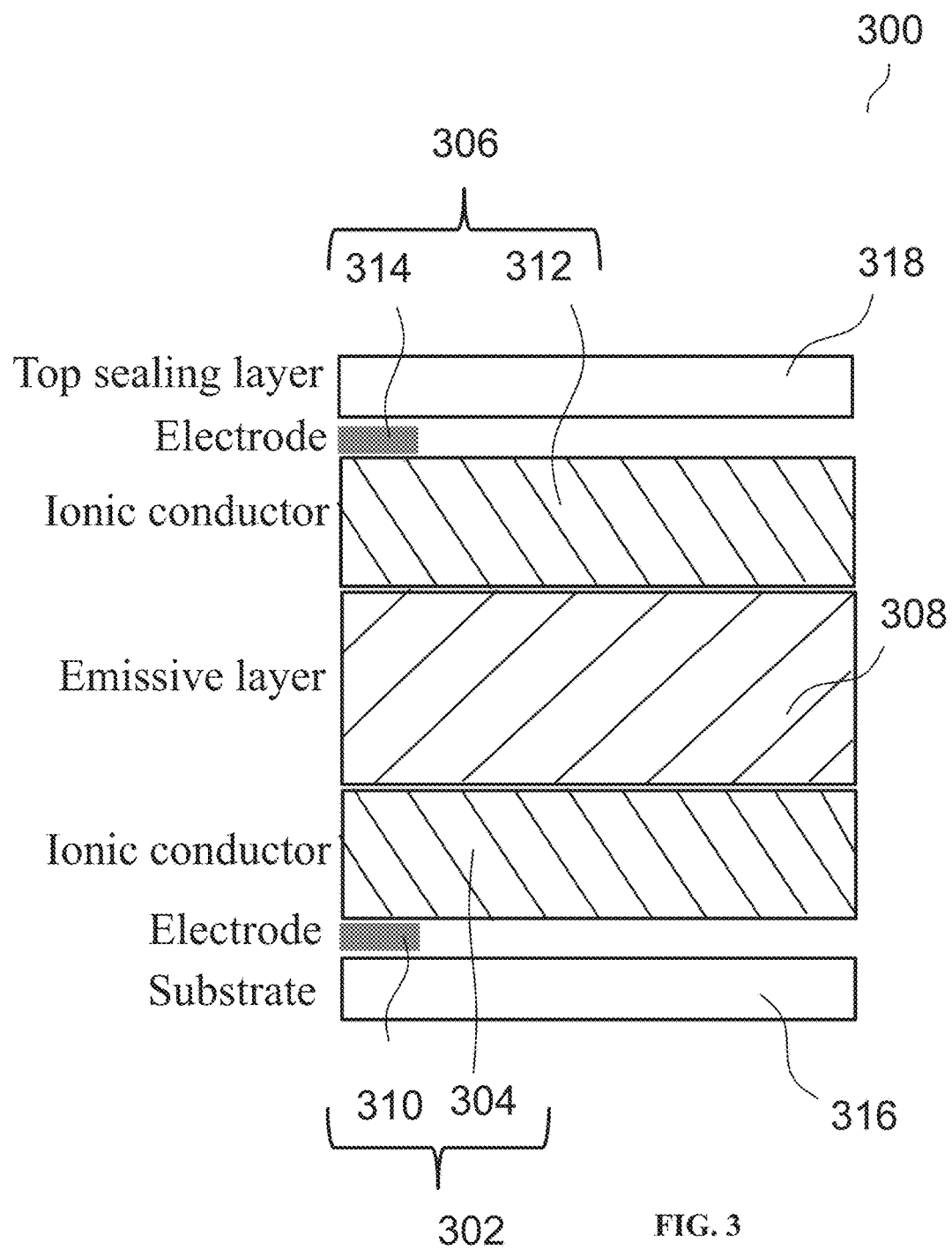
FIG. 3 shows a schematic of an electroluminescent device according to various embodiments.

FIG. 3 shows a schematic of an electroluminescent device 300 according to various embodiments. The electroluminescent device 300 may include an ionic conductor layer 304, a further ionic conductor layer 312, and an emission layer 308 between the ionic conductor layer 304 and the further ionic conductor layer 312.

The device 300 may be referred to as an alternating-current electroluminescent (ACEL) device.

The device 300 may further include a first electrode 310 on or in contact with the ionic conductor layer 304, and a second electrode 314 on or in contact with the further ionic conductor layer 312. The first electrode 310 and the ionic conductor layer 304 may make up the first contact structure 302, and the second electrode 314 and the further ionic conductor layer 312 may make up the second contact structure 306. The emission layer 308 may include one or more electroluminescent elements (which may be referred to as alternating-current electroluminescent (ACEL) materials) embedded in an elastomer.

In various embodiments, the ionic conductor layer 304, the further ionic conductor layer 312, and the emission layer 308, the first electrode 310 and the second electrode 314 may be over a substrate 316. The device 300 may also include a sealing layer 318 over the the ionic conductor layer 304, the further ionic conductor layer 312, the emission layer 308, the first electrode 310 and the second electrode 314. The ionic conductor layer 304, the further ionic conductor layer 312, the emission layer 308, the first electrode 310, the second electrode 314, and the sealing layer 318 may form a vertical stacked arrangement.

The emission layer 308 may be formed after forming the first contact structure 302. The second contact structure 310 may be formed after forming the emission layer. The sealing layer 318 may be formed after forming the second contact structure 310.

Examples of the ACEL materials may include, but are not limited to, optionally doped ZnS, optionally doped CdS, optionally doped CaS, optionally doped SrS, and combinations thereof. Different dopants and doping concentrations may be used. For example, magnesium, cobalt, silver, aluminum, copper, and cadmium may be used as the dopants or co-dopants with a doping concentration of between about 0.01 molar percentage (mol %) to about 0.1 molar percentage (mol %).

The ACEL materials may alternatively or additionally include conjugated polymers such as, but not limited to, poly(p-phenylene vinylene) (PPV), poly(9,9-di-n-octylfluorenyl-2,7-diyl) (PFO), poly (N-vinylcarbazole) (PVK), poly (p-phenylene) (PPP), and their derivatives, such as organic-inorganic composites. The ACEL materials may include electroluminescent polymers for light emitting electrochemical cell (LEEC). The ACEL materials may alternatively or additionally include ionic transition metal complexes (iTMCs).

The elastomers may include, but are not limited to, polysiloxanes, polyepoxides, polysulfide rubber, polyurethanes, polyacrylic and silicone (e.g. Ecoflex).

The emission layer 308 as illustrated in FIG. 3 may include ZnS:Cu/Ecoflex composite.

Capacitor $C_1$ may be formed by electrical double layers at the interface between the first electrode 310 and the ionic conductor layer 304, and Capacitor $C_3$ may be formed by electrical double layers at the interface between the second electrode 314 and the further ionic conductor layer 312. Capacitor $C_2$ may be formed by the ZnS:Cu/Ecoflex composite.

Figure 4A:
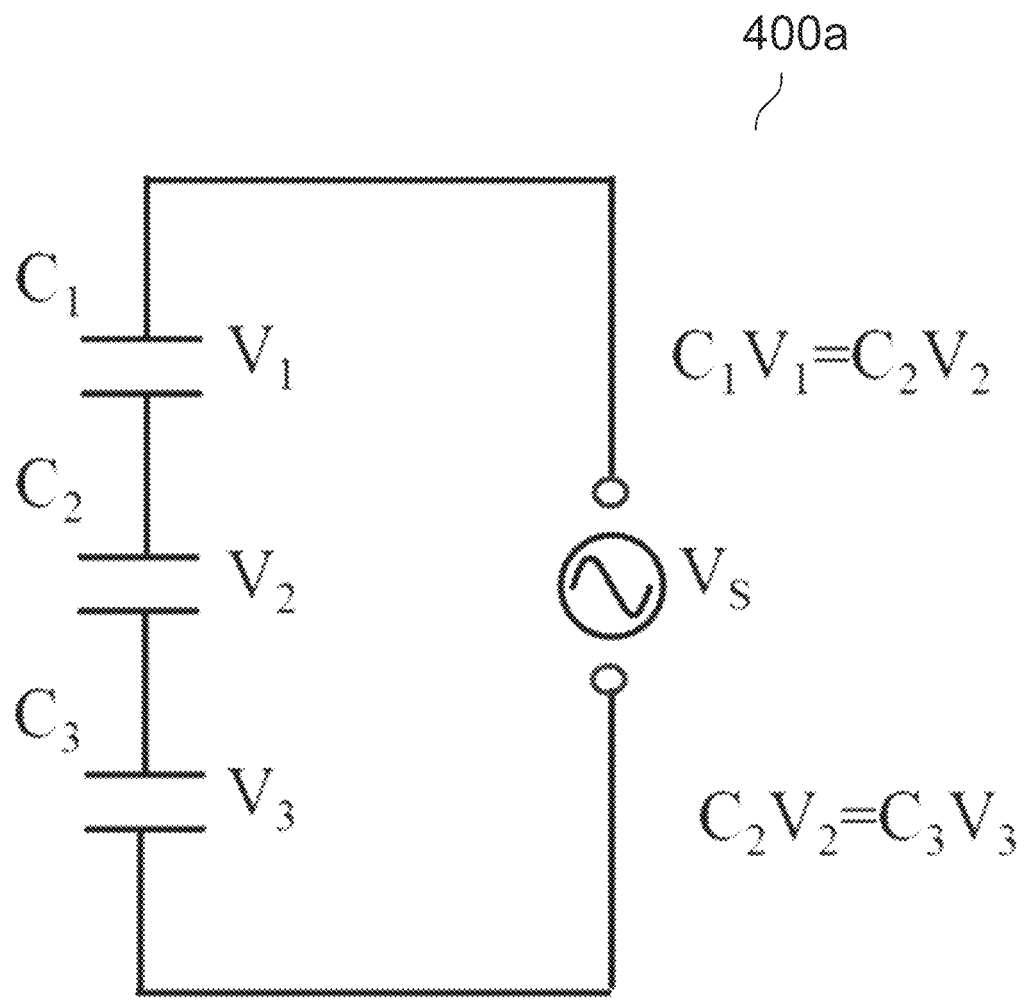
FIG. 4A shows a schematic of an equivalent circuit arrangement representing the device of FIG. 3 according to various embodiments coupled to an alternating current (AC) source.

FIG. 4A shows a schematic of an equivalent circuit arrangement 400a representing the device of FIG. 3 according to various embodiments coupled to an alternating current (AC) source. The AC source for applying the alternating voltage is denoted by $V_s$. The potential differences across $C_1$, $C_2$, and $C_3$ are denoted by $V_1$, $V_2$, and $V_3$ respectively. Capacitors $C_1$, $C_2$ and $C_3$ may be arranged in series.

Electrochemical stability may be a key consideration when the ionic conductors are applied in devices which operate under high voltage. ACEL devices may require about 100 to about 1000 V for light emission. Depending on the electrode materials, the electrochemical stability window for the lithium based polycarbonate electrolyte may be around 3 V.

As each electrical double-layer has a small charge separation (in the range of a few nm), each electrical double-layer may have a large capacitance in the order of about $10^{-1}$ F/m$^2$. On the contrary, the dielectric capacitor $C_2$ of the emission layer of the ACEL device including a polymer binder may have a significantly larger charge separation (around 200 µm), leading to a much smaller capacitance in the order of $\sim 10^{-7}$ F/m$^2$.

$C_2$ has a capacitive value, $C_2$, that may be much smaller compared to the capacitive value of capacitor $C_1$ ($C_1$) or the capacitive value of $C_3$ ($C_3$). The ratio of $C_2/C_1$ or the ratio of $C_2/C_3$ may be less than $10^{-4}$, e.g. about $10^{-5}$, depending on the area of the capacitors. As the capacitors connected in series, and the charges stored in each capacitor are the same, $C_1V_1=C_2V_2=C_3V_3$. Thus, most of the potential difference applied may be coupled across the emission layer which has a smaller capacitance, with much smaller potential differences distributed across the double layer interfaces (~$10^{-3}$ V for ACEL devices operating at 1000 V) due to their much larger capacitances.

Figure 4B:
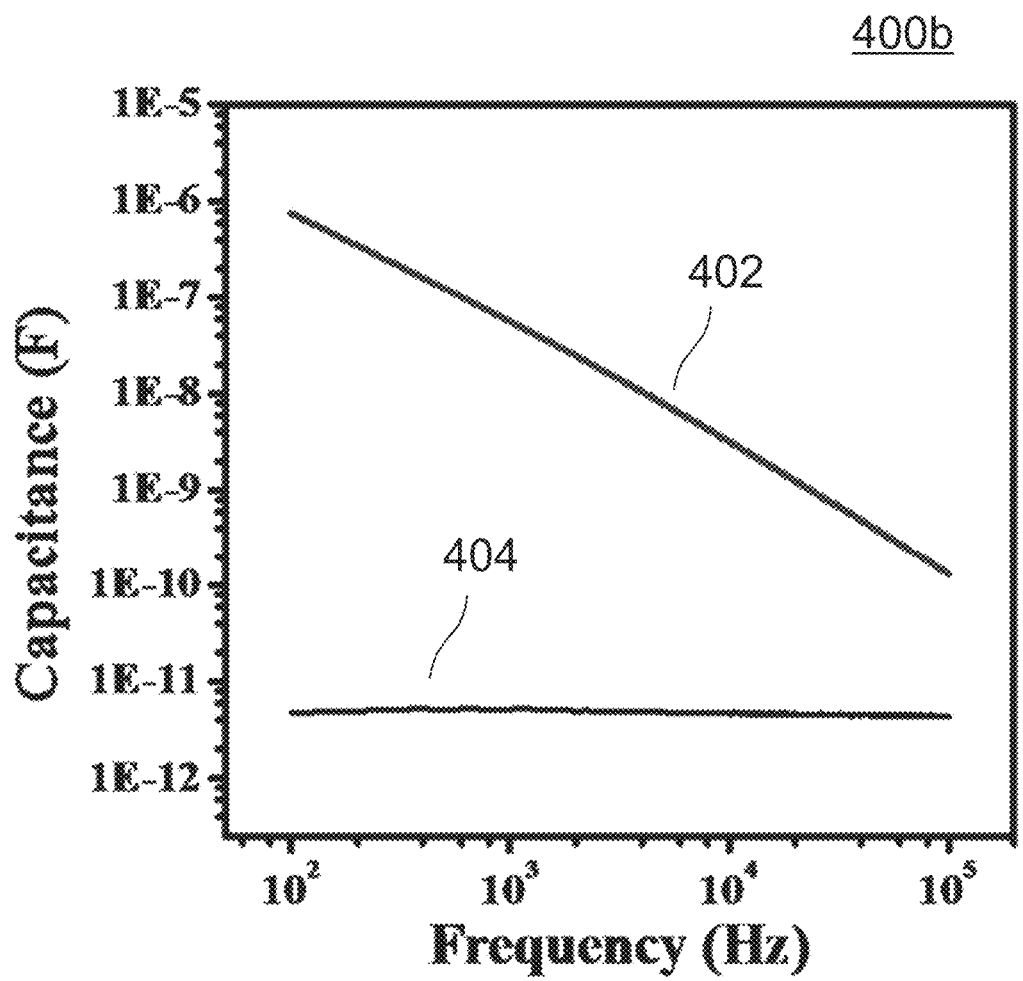
FIG. 4B is a plot of capacitance (farads or F) as a function of frequency (hertz or Hz) showing the variation of the capacitance of the double layer and the capacitance of the emission layer of a device according to various embodiments.

FIG. 4B is a plot 400b of capacitance (farads or F) as a function of frequency (hertz or Hz) showing the variation of capacitance of the double layer (represented by line 402) and the capacitance of the emission layer (represented by line 404) of a device according to various embodiments.

Figure 4C:
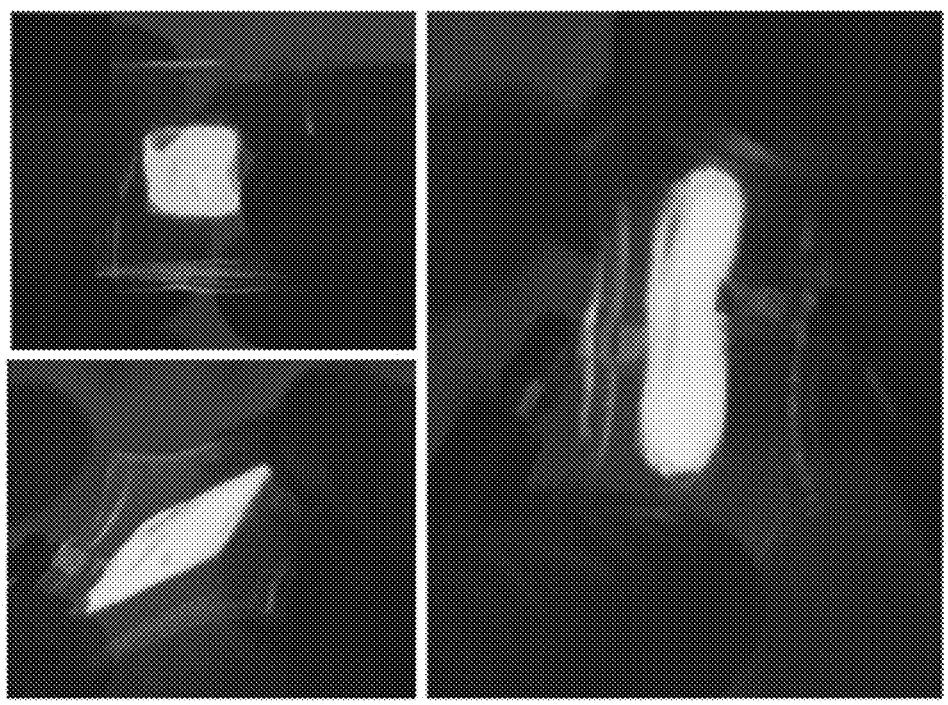
FIG. 4C shows photos of the stretchable electroluminescent (EL) device according to various embodiments stretched in different directions.
Figure 4D:
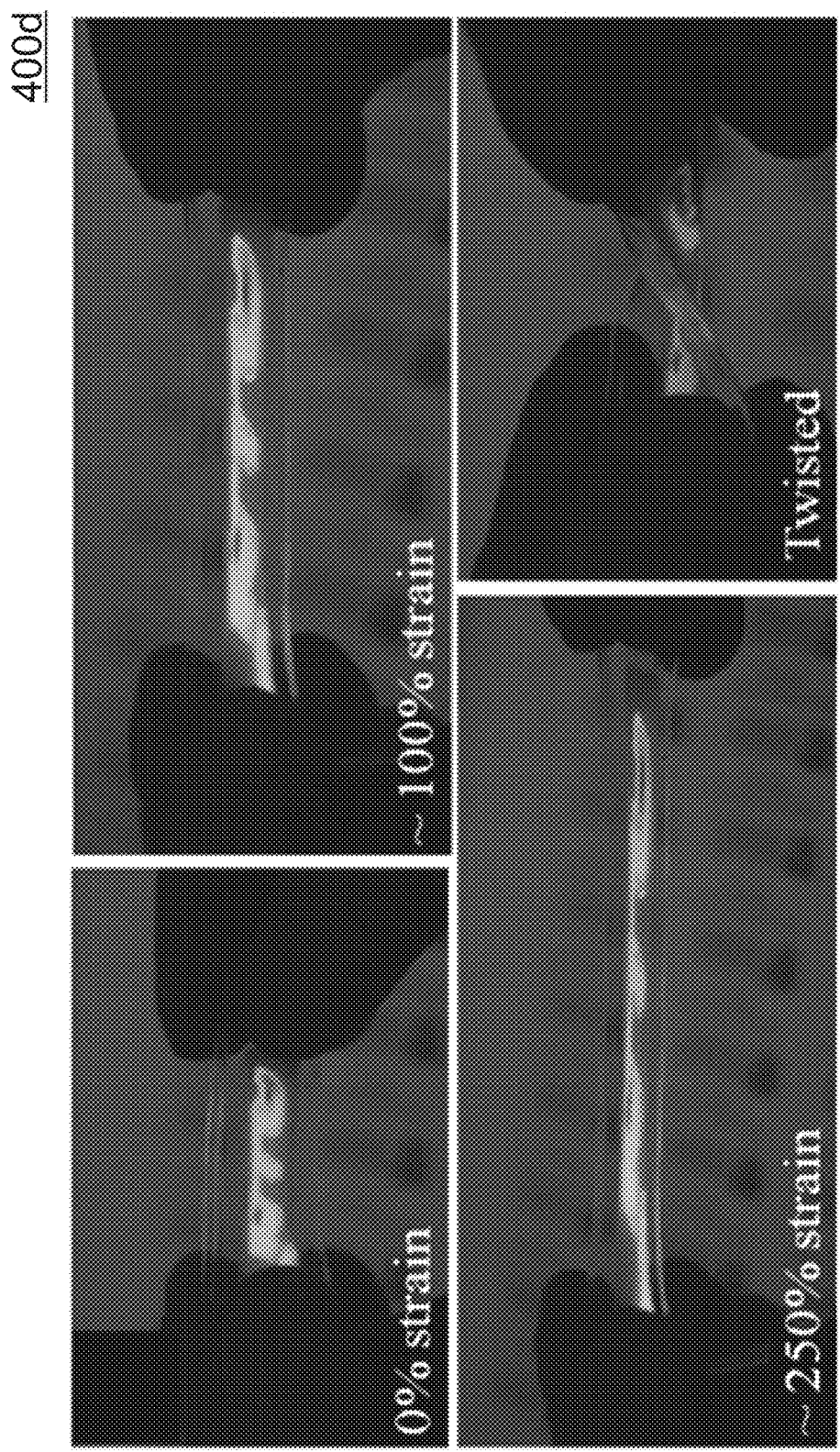
FIG. 4D shows photos of the electroluminescent (EL) device according to various embodiments under stretch and under twist.

FIG. 4C shows photos 400c of the stretchable electroluminescent (EL) device according to various embodiments stretched in different directions. FIG. 4D shows photos 400d of the electroluminescent (EL) device according to various embodiments under stretch and under twist.

As shown in FIG. 4C and FIG. 4D, a bright emission may be achieved in the ACEL devices using ionic conductor as the highly stretchable electrodes, even when the devices are stretched, twisted or deformed. The device may be stretched uniaxially, elongated diagonally, twisted or subjected to other mechanical deformations, and may still emit light upon application of an AC potential difference voltage.

The ionic conductor layers and emission layers may be easily deposited with solution-processable methods. The device may also be patterned into different device geometries, i.e. formed as part of an array. The stretchable ACEL device shown in FIG. 4D is patterned as part of an array. Emission properties of the array may be maintained even under highly stretched states.

Figure 4E:
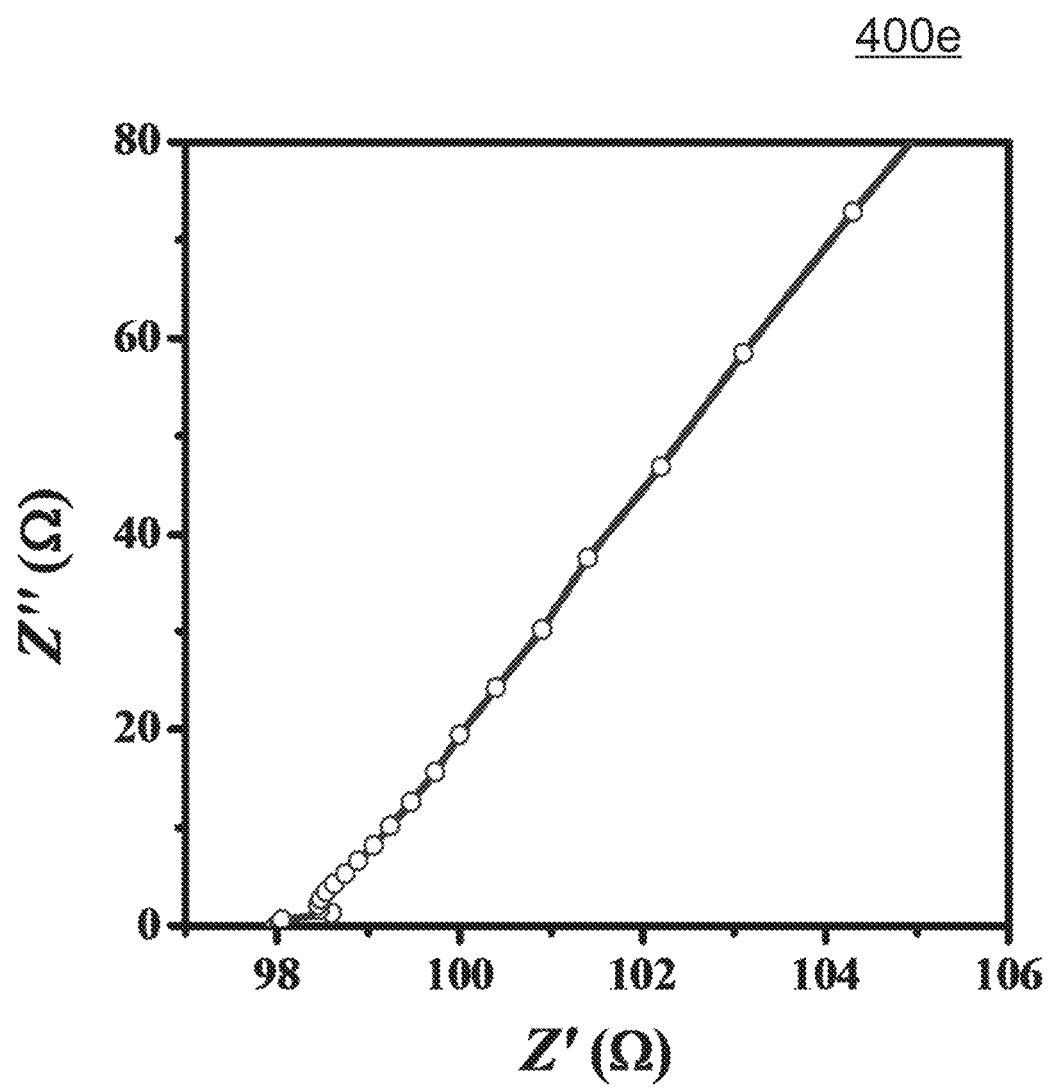
FIG. 4E is a plot of the imaginary part of impedance (ohms or Ω) as a function of the real part of impedance (ohms or 1) showing electrochemical impedance spectroscopy measurement of an ionic conductor used in a device according to various embodiments.

FIG. 4E is a plot 400e of the imaginary part of impedance (ohms or 1) as a function of the real part of impedance (ohms or 1) showing electrochemical impedance spectroscopy measurement of an ionic conductor used in a device according to various embodiments. The ionic conductor is sandwiched between two indium tin oxide (ITO) glass. Each ITO glass has a width of 0.7 cm, a length of 1.3 cm and a thickness of 0.05 cm.

Figure 4F:
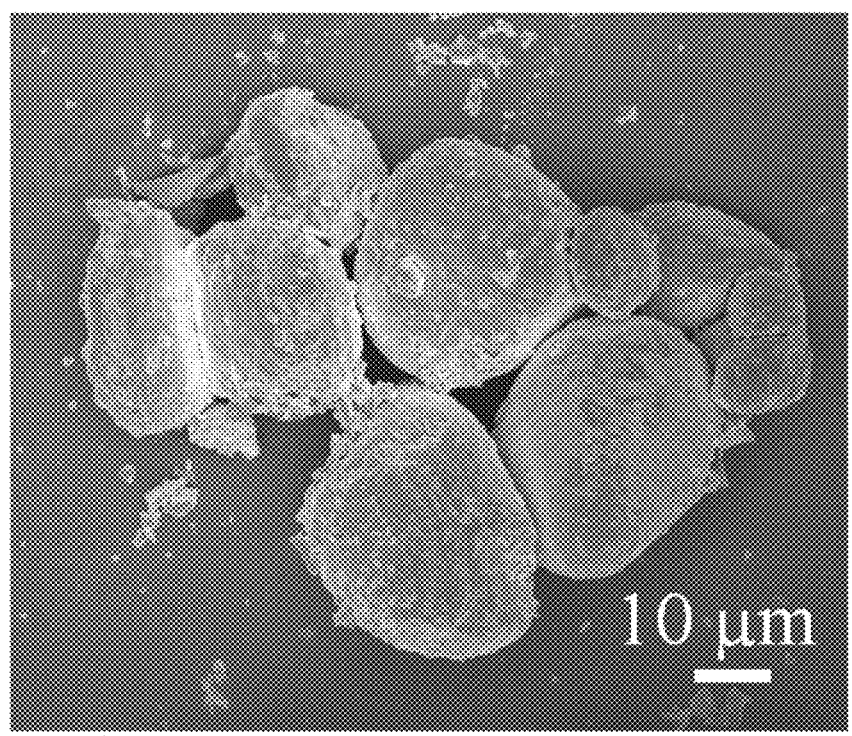
FIG. 4F is a scanning electron microscopy image of zinc sulphide doped with copper (ZnS:Cu) which may be used in the emission layer of the device according to various embodiments.

FIG. 4F is a scanning electron microscopy image 400f of zinc sulphide doped with copper (ZnS:Cu) which may be used in the emission layer of the device according to various embodiments.

Ionic conductors may possess extremely high transmittance and stretchability compared to conventional electronic conductors. The ionic conductor layer solution may include an ionic entity and a polymer host in an organic solvent. The ionic entity may be an alkali salt such as lithium iodide (LiI), sodium iodide (NaI), potassium iodide (KI), lithium chloride (LiCl), sodium chloride (NaCl), potassium chloride (KCl), lithium perchlorate (LiClO$_4$), sodium perchlorate (NaClO$_4$), and potassium perchlorate (KClO$_4$), or an ionic liquid with an cation such as imidazolium, pyridinium, alkylammonium, alkylphosphonium, pyrrolidinium, guanidinium, and alkylpyrrolidinium.

The polymer host may include, but is not limited to, poly(ethylene oxide) (PEO), poly(propylene oxide) (PPO), poly(acrylonitrile) (PAN), poly(methyl methacrylate) (PMMA), poly(vinyl chloride) (PVC), poly(vinylidene fluoride) (PVDF) and poly(acrylic acid) (PAA) or any combination thereof.

The organic solvent may include, but is not limited to, dimethyl carbonate (DMC), diethyl carbonate (DEC), c-butyrolactone (BL), propylene carbonate (PC), ethylene carbonate (EC), acetonitrile, or any combination thereof.

Figure 4G:
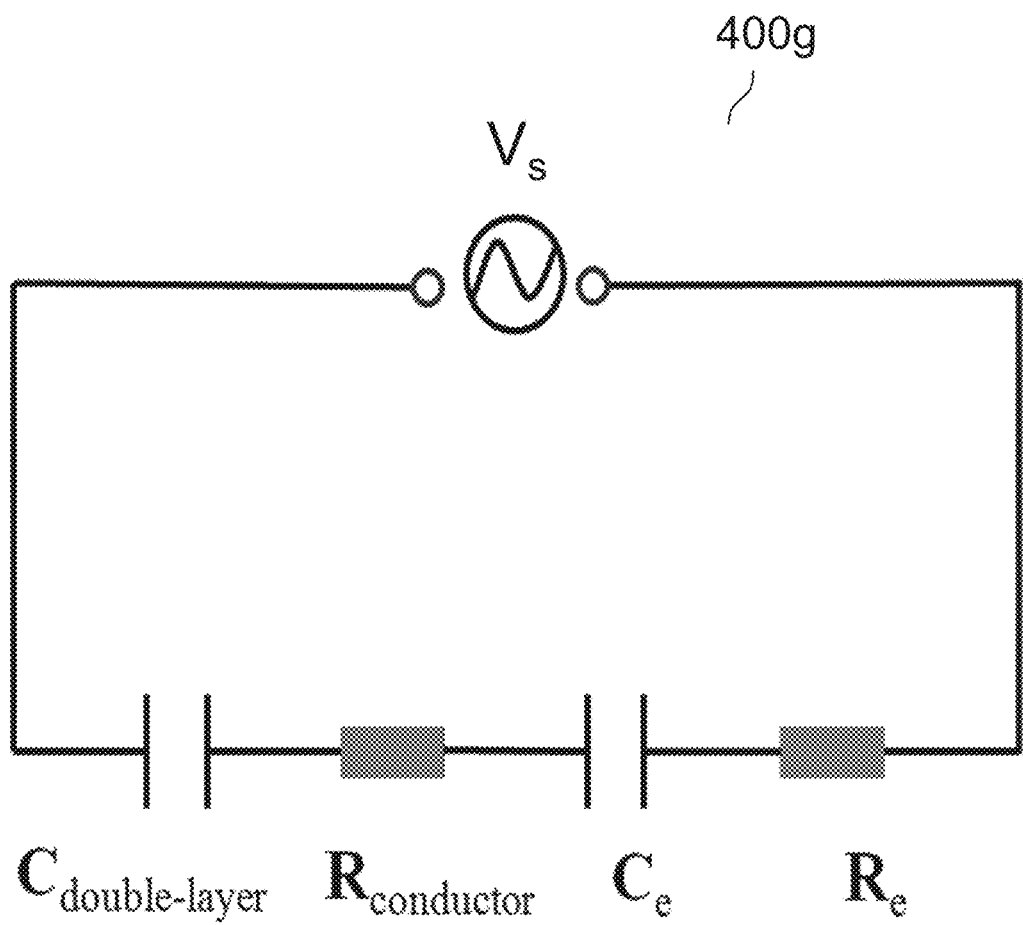
FIG. 4G shows another schematic of an equivalent circuit arrangement representing the device according to various embodiments.

FIG. 4G shows another schematic of an equivalent circuit arrangement 400g representing the device according to various embodiments. $C_{double-layer}$ represents the capacitance of one or more electrical double layers; $R_{conductor}$ represents the electrical resistance of the ionic conductor layers; $C_e$ represents the effective capacitance of the emission layer; and $R_e$ represents the effective resistance of the emission layer. $V_s$ represents the voltage source for applying the alternating current (AC) potential difference voltage.

Figure 4H:
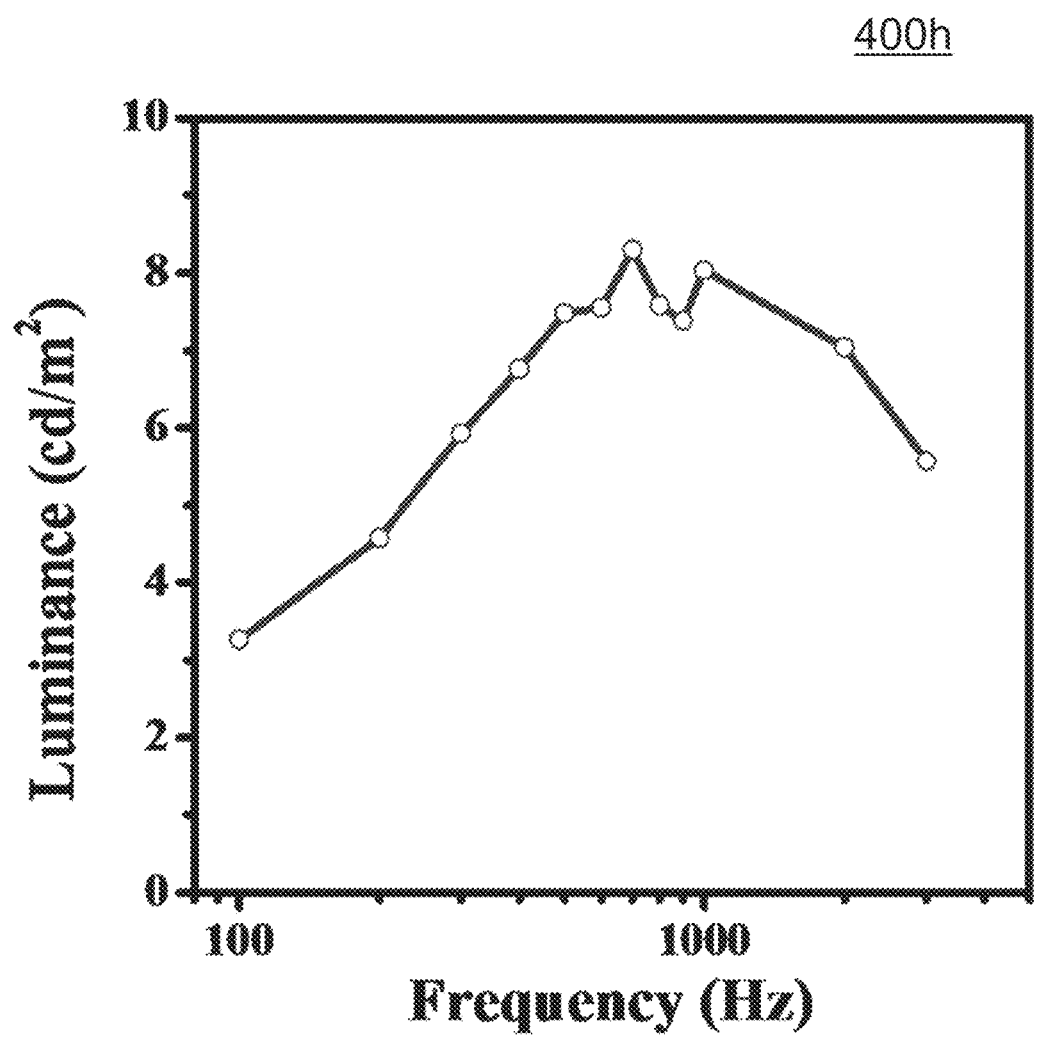
FIG. 4H is a plot of luminance (candela per meter square or cd/m$^2$) as a function of frequency (hertz or Hz) showing the luminance-frequency characteristics of the electroluminescent device according to various embodiments.

FIG. 4H is a plot 400h of luminance (candela per meter square or cd/m$^2$) as a function of frequency (hertz or Hz) showing the luminance-frequency characteristics of the electroluminescent device according to various embodiments.

As shown in FIG. 4H, the luminance of the EL device increases as the frequency of the applied bias increases for voltage frequencies below 1 kHz. The luminance centers may be excited and radiatively relaxed for light emission under each cycle of applied voltage. The emission intensity may increase with increasing applied frequency, when the applied frequency is below a threshold frequency. Further increasing the applied frequency beyond the threshold frequency may lead to decrease in the emission intensity. The equivalent circuit for the emission layer in ACEL device may be include an effective resistance ($R_e$) and a capacitance ($C_e$) connected in series, as shown in FIG. 4G. The effective resistance ($R_e$) of the emission layer may be governed by the resistance in the phosphor particles, and decreases with increasing applied frequency, which may be attributed to the increased conductivity in the phosphor particles as the relative recombination time decreases under increasing frequency. On the contrary, the resistance ($R_{conductor}$) of the ionic conductor layer increases as the applied frequency increases, which affects the device performance after the effective resistance ($R_e$) in the emission layer decreases to a certain value. Though the operating frequency of the ACEL devices may be further increased by improving the conductivity of the ionic conductor layer, high frequencies HO kHz) may lead to saturation effects in the phosphors since the accelerated electrons may not be able to recombine during the cycles. The high-frequency operation may also reduce the lifetime of the phosphors ($L/L_0=(1+\alpha t)^{-1}$, where L is the actual brightness, $L_0$ is the initial brightness, a is a constant nearly proportional to the frequency). For a typical EL device, a lifetime requirement of 2000 hr may be achieved with the AC frequency of 400 Hz.

Figure 5A:
FIG. 5A is an image showing a glass bottle of as-prepared ionic conductor solution used to form a device according to various embodiments, as well as a glass slide coated with the ionic conductor (about 200 μm thick).
Figure 5A:
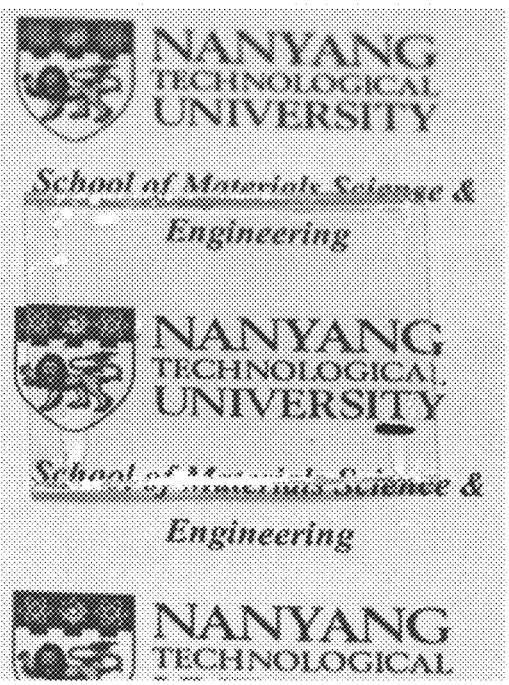

FIG. 5A is an image 500a showing a glass bottle of as-prepared ionic conductor solution used to form a device according to various embodiments (left), as well as a glass slide coated with the the ionic conductor (about 200 μm thick) (right).

Figure 5B:
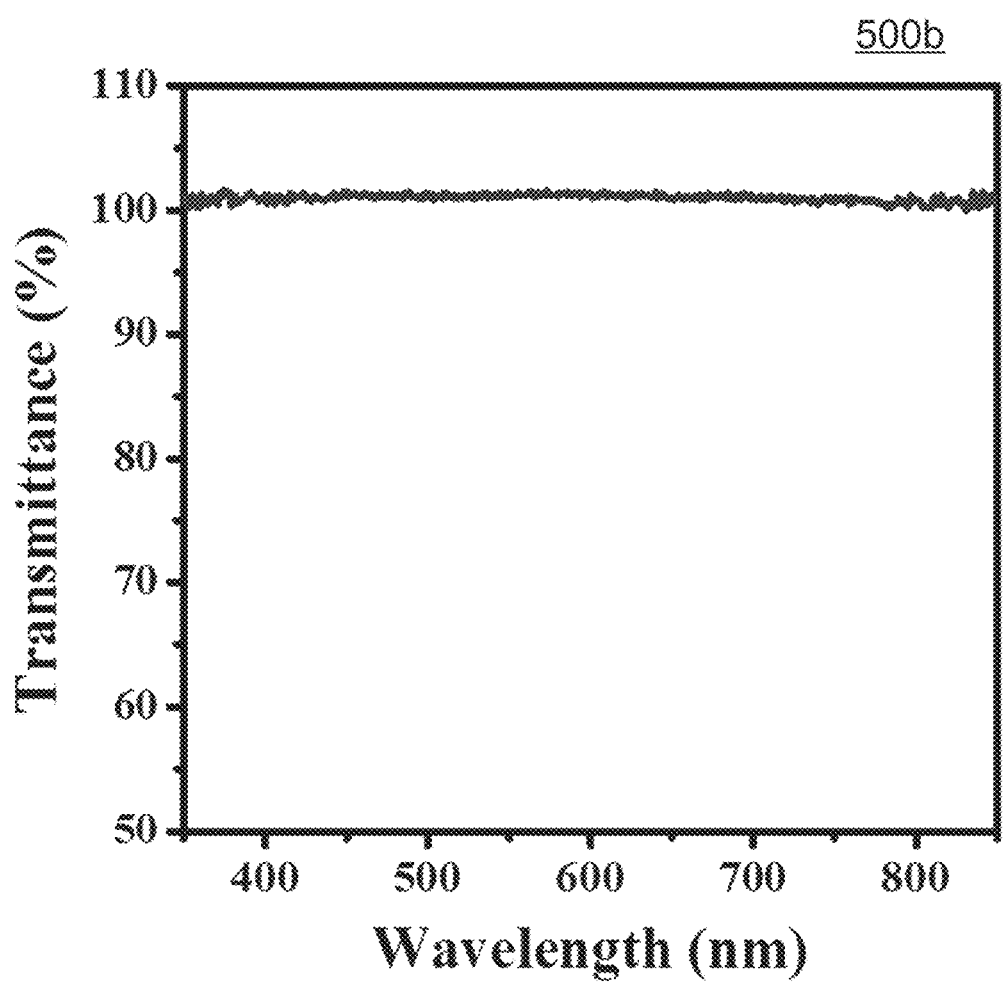
FIG. 5B is a plot of percentage transmittance (percent or %) as a function of wavelength (nanometers or nm) showing the transmittance spectrum of the ionic conductor-coated glass slide of FIG. 5A.

The ionic conductor solution in a 50 ml bottle and coated onto the glass slide shown in FIG. 5A shows excellent transparency. FIG. 5B is a plot 500b of percentage transmittance (percent or %) as a function of wavelength (nanometers or nm) showing the transmittance spectrum of the ionic conductor-coated glass slide of FIG. 5A. The transparency of the ionic conductor is measured using a bare glass slide as a reference.

As presented in FIG. 5B, the transmittance of the ionic conductor almost reaches 100% (beyond the photometric accuracy, ±0.3%, of the Shimadzu UV-2500pc spectrometer) in the wavelength range of about 350 nm to about 850 nm.

Figure 5C:
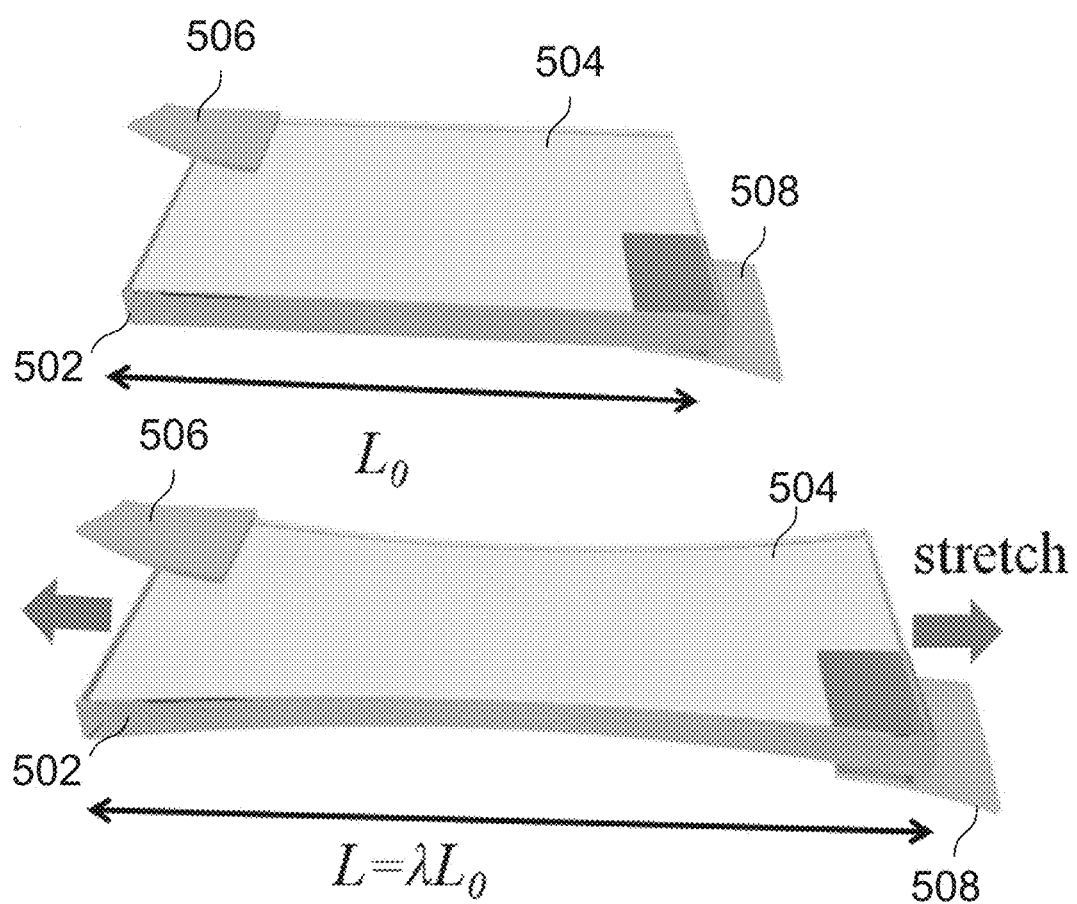
FIG. 5C is a schematic showing a 3M VHB tape coated with an ionic conductor (for use in a device according to various embodiments) with two graphite electrodes as external connections to study the electrical properties and stretchability of the ionic conductor.

FIG. 5C is a schematic showing a 3M VHB tape 502 coated with an ionic conductor 504 (for use in a device according to various embodiments) with two graphite electrodes 506, 508 as external connections to study the electrical properties and stretchability of the ionic conductor.

Figure 5D:
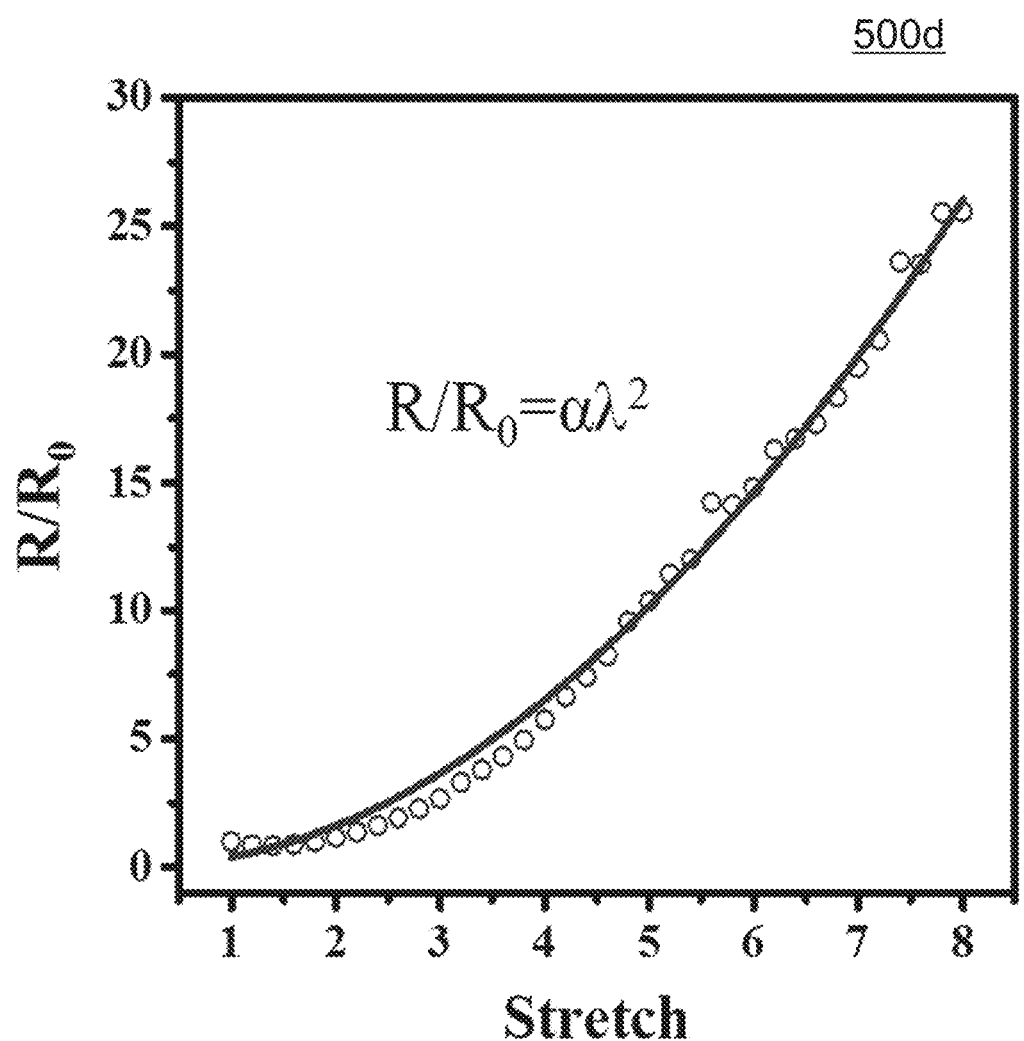
FIG. 5D is a plot of the resistance ratio (of the resistance of the ionic conductor in the deformed state to the resistance of the ionic conductor in the undeformed state ($R/R_0$)) as a function of the stretching strain (λ) according to various embodiments.

The top portion of FIG. 5C shows the tape 502 at its original length $L_0$. The bottom portion of FIG. 5C shows the tape 502 being stretched to a length $\lambda L_0$, where $\lambda$ represents the stretching strain. The ionic conductor has been tested under different stretching strains. FIG. 5D is a plot 500d of the resistance ratio (of the resistance of the ionic conductor in the deformed state to the resistance of the ionic conductor in the undeformed state (i.e. $R/R_0$)) as a function of the stretching strain ($\lambda$) according to various embodiments. The ionic conductor has been tested under stretching strains of up to 700%. The resistance of the ionic conductor increases proportionally with $\lambda^2$.

The resistance of a conductor may be provided by $R=\rho L/A$, where $\rho$ is the resistivity, L and A are the length and cross-sectional area of the conductor. The L/A of the ionic conductor in a deformed state is proportional to $\lambda^2 L_0/A_0$, where $L_0$ and $A_0$ are the length and cross-sectional area of the ionic conductor in the undeformed state. The resistance line of FIG. 5D closely matches the $R/R_0=\alpha\lambda^2$ curve (where $\alpha$ is a constant), indicating that change of the resistance is only attributed to the geometric change of the ionic conductor and the resistivity is independent of the mechanical deformations.

The stretchability and mechanical stability of the ionic conductors significantly exceed that of conventional transparent electrodes. For example, the resistance of the stretchable and transparent silver nanowires (AgNWs) embedded in elastomers is known to increase about 20 to about 35 times at stretching strains of 100%. The resistance in carbon nanotube (CNT) films embedded in elastomer is known to increase more than 8 times at stretching strains of 120%. In addition, the significantly deteriorated conductivity under repeated deformations may be another critical problem in conventional electrodes. On the contrary, the ionic conductor may easily accommodate the mechanical deformations, and may maintain fairly constant conductivity after recovering from the stretch.

Figure 5E:
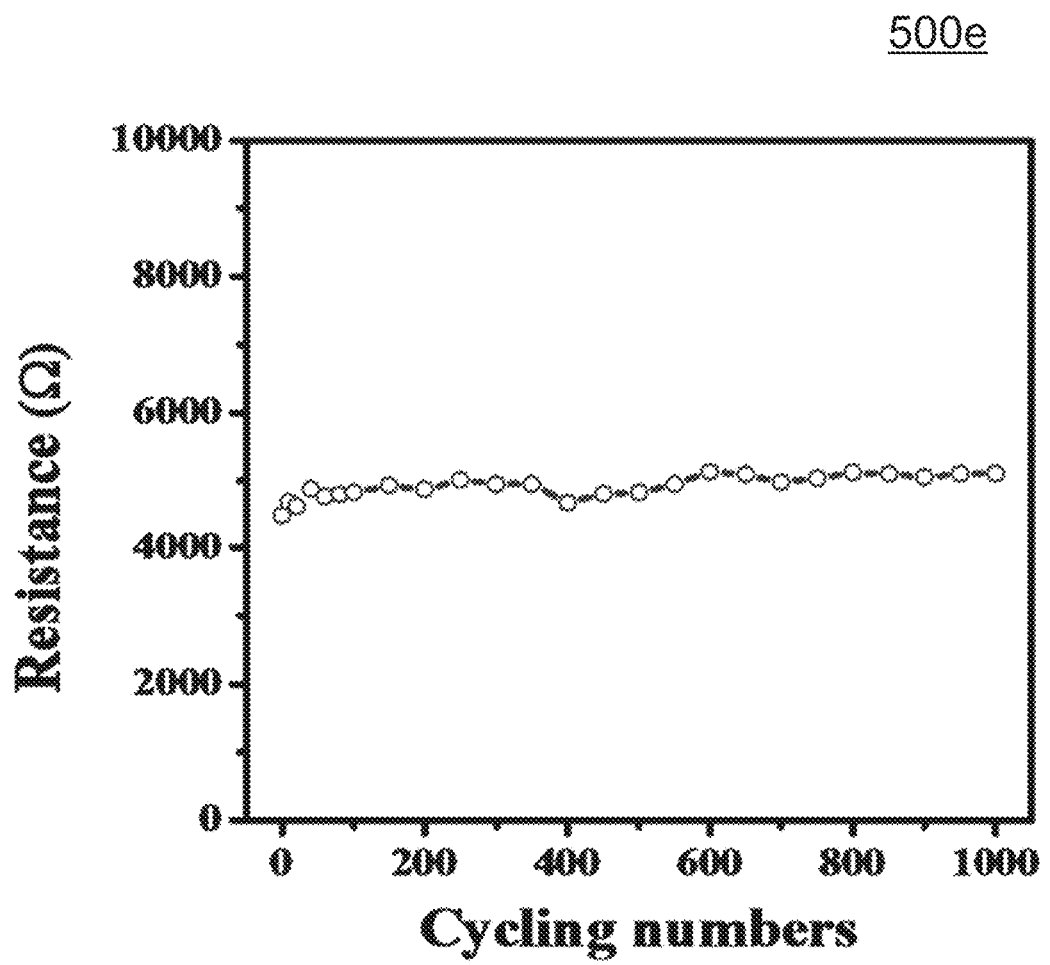
FIG. 5E is a plot of the electrical resistance (ohms or Ω) of an ionic conductor (used in a device according to various embodiments) as a function of cycling numbers, with each cycle including stretching from a relaxed state to up to 700% and back to the relaxed state.

FIG. 5E is a plot 500e of the electrical resistance (ohms or $\Omega$) of an ionic conductor (used in a device according to various embodiments) as a function of cycling numbers, with each cycle including stretching from a relaxed state to up to 700% and back to the relaxed state. FIG. 5E shows that the electrical resistance remains fairly constant as the number of cycles increases for 1000 cycles. In fact, FIG. 5E shows that the increase in electrical resistance after 1000 cycles to be less than 10% of the original electrical resistance of the device. While the conductivity of the ionic conductor may be lower compared to the electronic conductors (around $10^2$ lower), ionic conductors may still be suitable for electronic components such as ACEL devices in which the conductivity requirements may easily be met.

Figure 6A:
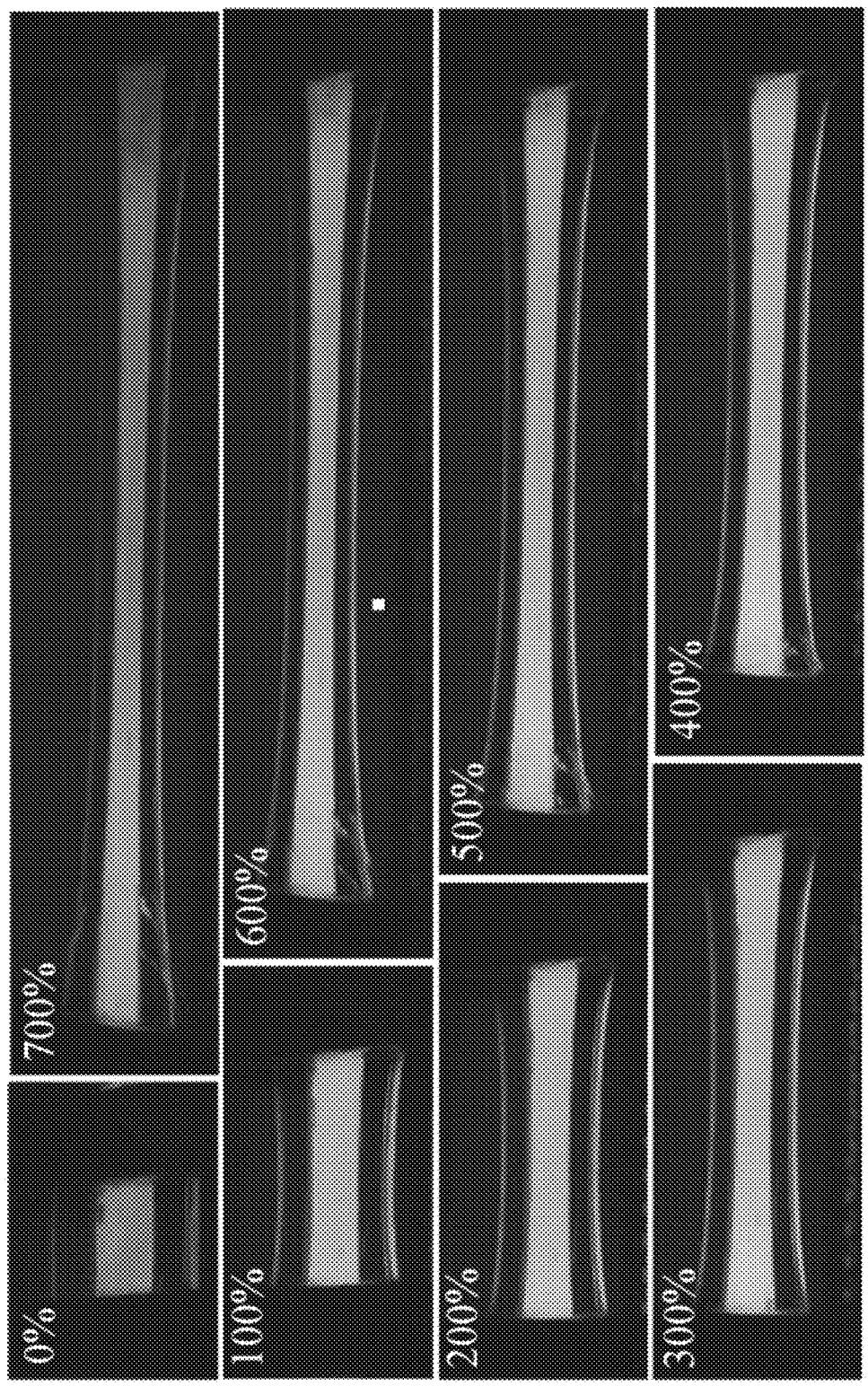
FIG. 6A are photos showing electroluminescent devices according to various embodiments being stretched to different strains.

While stretchable ACEL devices have been demonstrated with AgNWs film embedded in PDMS as stretchable transparent conductors, these devices demonstrate limited stretchability at 100%. Utilizing the extremely stretchable and transparent ionic conductor, the stretchability of the ACEL devices have been shown to have significant improvement. FIG. 6A are photos 600a showing electroluminescent devices according to various embodiments being stretched to different strains. As shown in FIG. 6A, the ACEL devices may be elongated up to 700% while maintaining device operation.

Figure 6B:
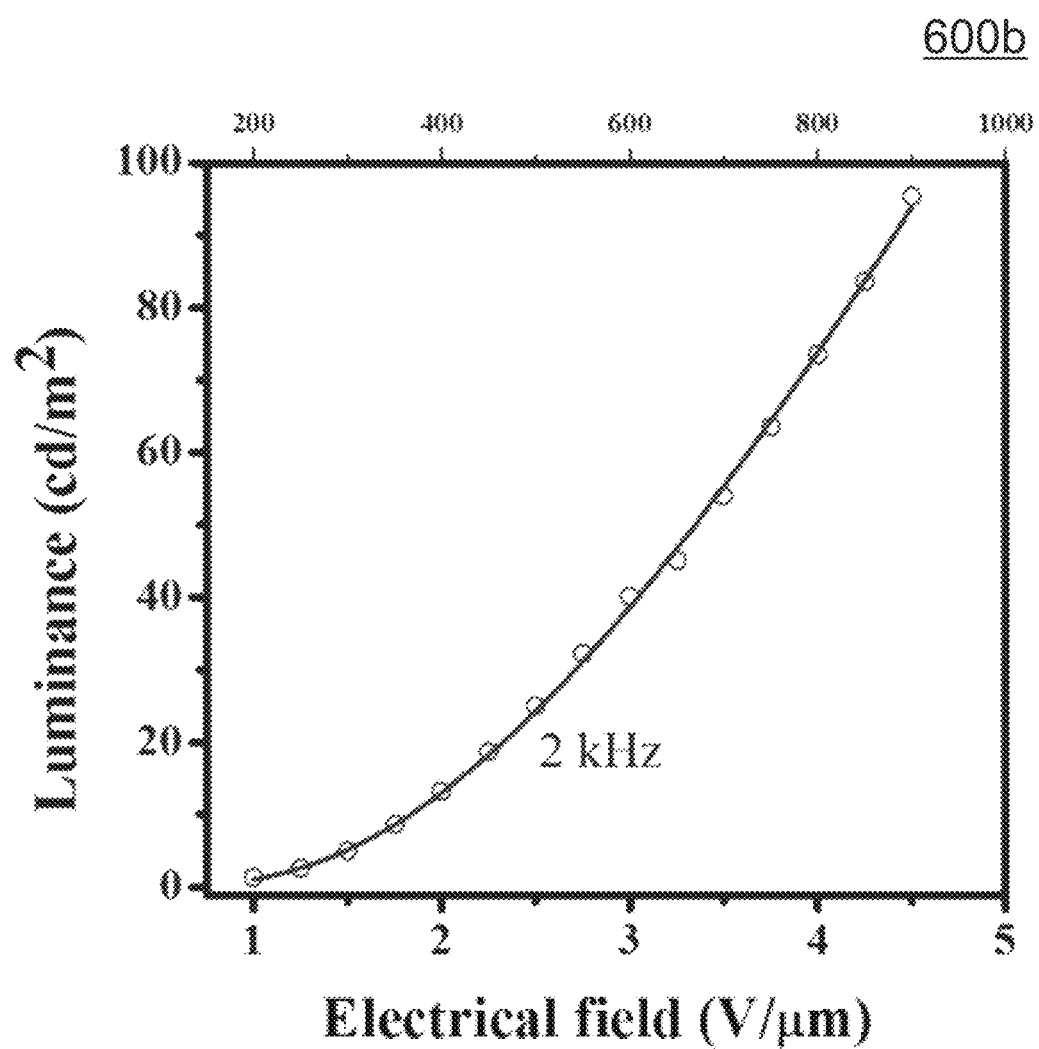
FIG. 6B is a plot of luminance (candela per meter square or cd/m$^2$) as a function of electrical field (volts/micrometer or V/μm) showing the luminance-electrical field characteristics of the stretchable electroluminescent device according to various embodiments under 0% strain.
Figure 6C:
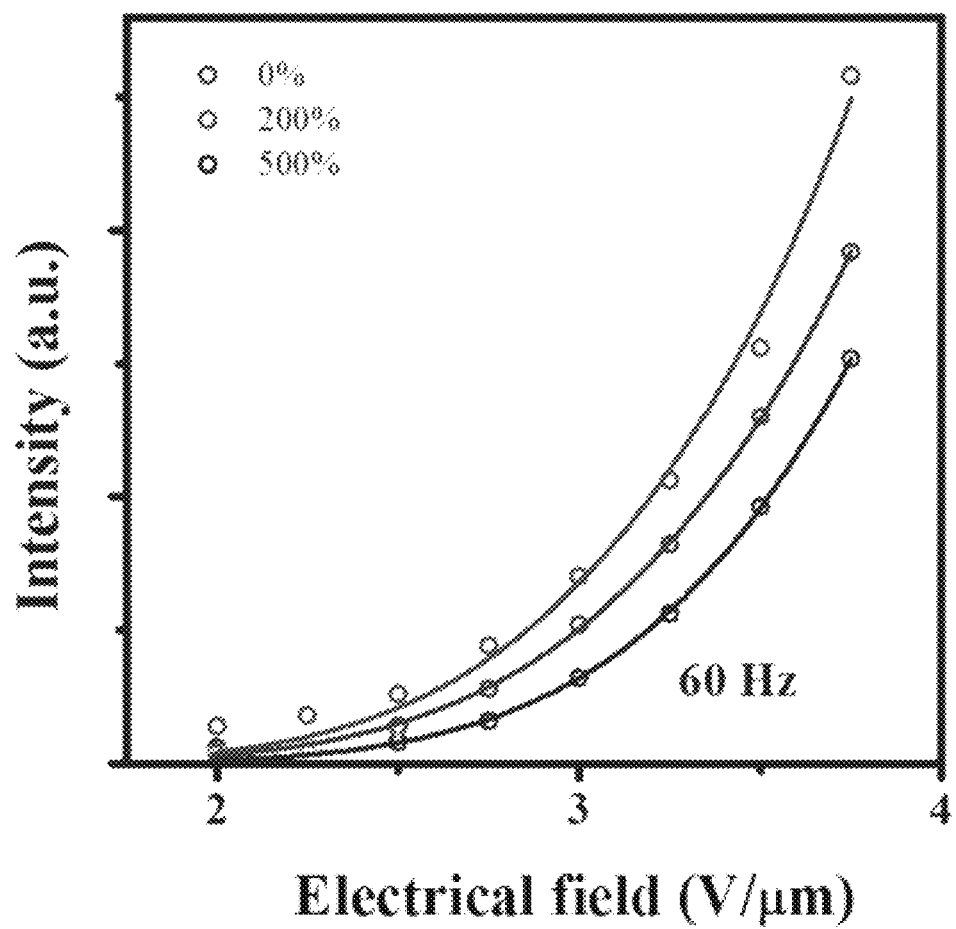
FIG. 6C is a plot of intensity (arbitrary units or a.u.) as a function of electrical field (volts/micrometer or V/μm) showing the luminance-electrical field characteristics of the stretchable electroluminescent device according to various embodiments under different strains.

FIG. 6B is a plot 600b of luminance (candela per meter square or cd/m$^2$) as a function of electrical field (volts/micrometer or V/μm) showing the luminance-electrical field characteristics of the stretchable electroluminescent device according to various embodiments under 0% strain. FIG. 6C is a plot 600c of intensity (arbitrary units or a.u.) as a function of electrical field (volts/micrometer or V/μm) showing the luminance-electrical field characteristics of the stretchable electroluminescent device according to various embodiments under different strains.

FIG. 6B shows the emission performance of the extremely stretchable ACEL devices before stretch. Luminance of the ACEL device has been plotted against as a function of electrical field at the frequency of about 2 kHz. The relationship between emission brightness and the applied voltage on the ACEL device follows the equation $L=L_0\exp(-\beta/V^{1/2})$, where L is the luminance, V is the applied voltage, and $L_0$ and $\beta$ are the constants determined by the devices. The experiment data fits well with the equation (as shown in FIG. 6B). Further, experiment data of the device under strain also fits well with the equation with varied $L_0$ and $\beta$ (as shown in FIG. 6C). The relationship between the emission brightness and applied voltage leads to unique behaviour of the device under different stretch strains.

Figure 6D:
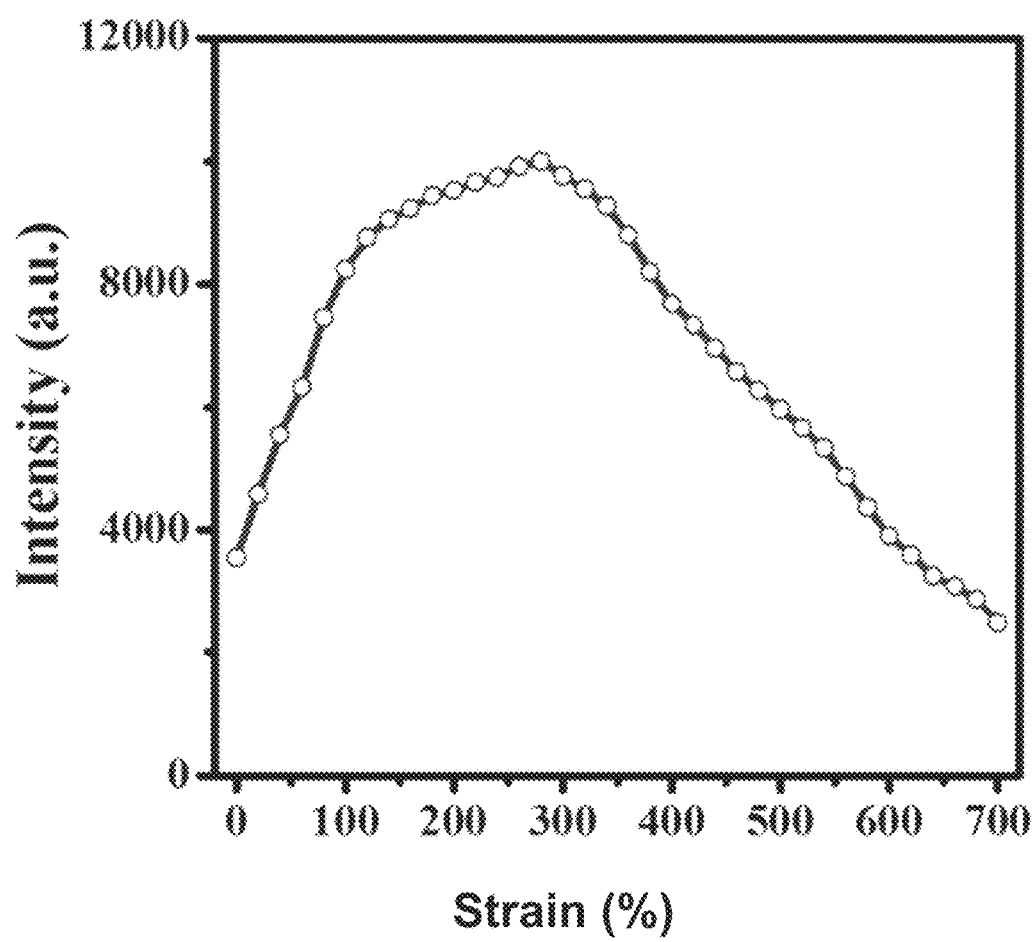
FIG. 6D is a plot of intensity (arbitrary units or a.u.) as a function of stretch strain (percent or %) of the device according to various embodiments.
Figure 6E:
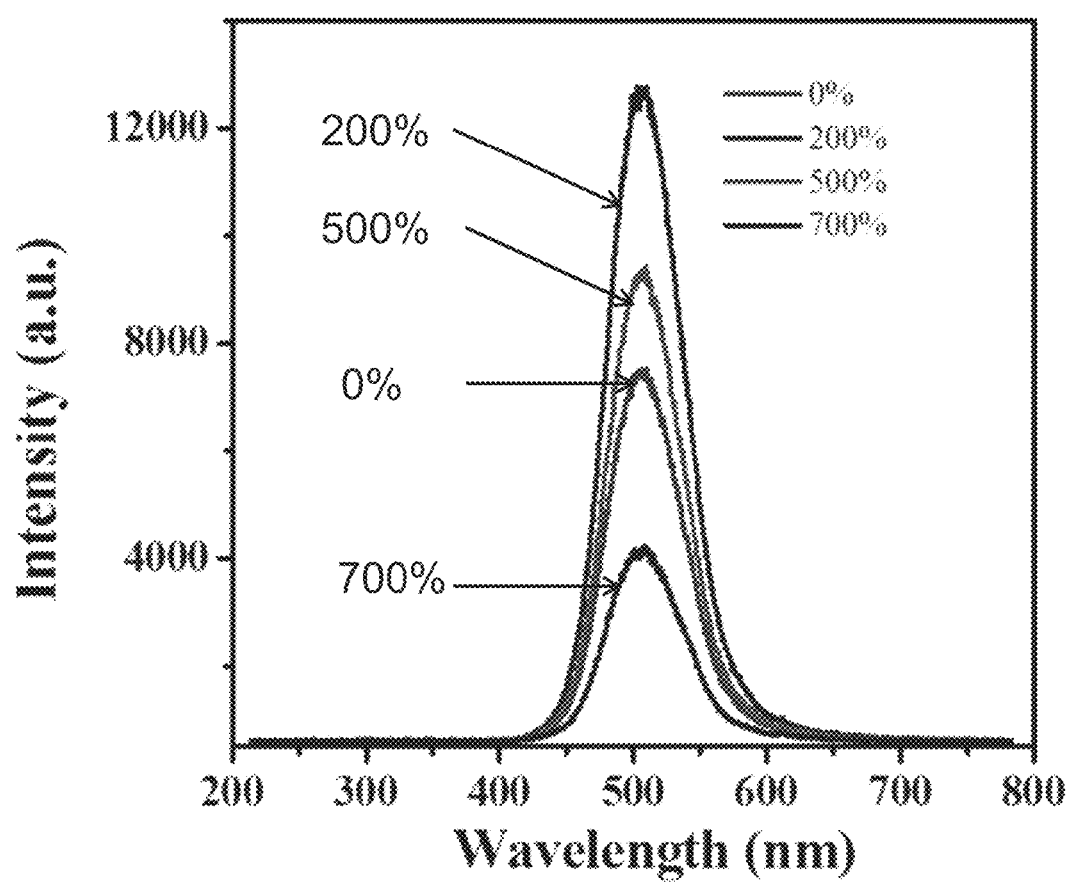
FIG. 6E is a plot of intensity (arbitrary units or a.u.) as a function of wavelengths (nanometers or nm) of the device according to various embodiments under different strains.

The emission performance was examined when the device was stretched to different states under constant bias. FIG. 6D is a plot 600d of intensity (arbitrary units or a.u.) as a function of stretch strain (percent or %) of the device according to various embodiments. As shown in FIG. 6D, the emission intensity of the stretchable EL device first increases with the stretching strain and reaches a maximum value at 280% ($I_{280}/I_0=282\%$, where $I_{280}$ and $I_0$ are the emission intensity at 280% and 0% strains respectively). The emission intensity then decreases when the strain exceeds 280%. The emission intensity at a strain of 700% is about 70% of the emission intensity at 0% strain (i.e. the original unstrained state). Various embodiments may achieve an emission intensity, at a strain of any value between about 200% to about 700%, above or about 70% of the emission intensity at 0% strain. FIG. 6E is a plot 600e of intensity (arbitrary units or a.u.) as a function of wavelengths (nanometers or nm) of the device according to various embodiments under different strains. The waveform of the emission spectra of the device remains relatively unchanged under different strains. The variation of the emission intensity of the stretchable EL device under different strains may be understood by the emission brightness-applied voltage relationship combined with the effects of a reduced thickness of the emission layer as well as increased device area under increasing strains. Reducing the film thickness leads to increase in the electrical field in the emission layer (contributing to increased device brightness) while increasing the device area leads to a declining phosphor density in the polymer matrix (which contributes to a reduction in device brightness). The relationship between the emission film thickness and phosphor density in the emission layer was previously reported in stretchable ACEL devices using AgNWs as the transparent electrode (J. Wang et al., Nanoscale, 6, 10734, 2014). The devices of Wang et al. showed slight increases in the emission intensity below strains of 30% with subsequent decrease in the intensity under larger strains. However, in the present experiment involving ACEL devices with ionic conductors, the intensity was observed to increase until the strains reached at 280%.

The largely varied network structure and resistance in the AgNW films which were used as the stretchable and transparent conductor in Wang et al. may play an important role in the reduction of emission under strain above 30%. Light transmittance may take place through the open regions of the network structure. However, the electrical field may be focused around the nanowires with decreased field intensities in the open regions away from the nanowires, due to higher resistance in the open regions. Under increased strains, the area of the open zones may increase, resulting in further decreases in the electrical fields in these open regions, thus resulting in lower emission intensities. Compared to the AgNW network, ionic conductor layers may fully cover the surface of the emission layer when stretched, thus exhibiting a much more stable resistance throughout the ionic conductor layer under different strains. Consequently, the strain of the electrode layers (i.e. the ionic conductor layers) may cause a smaller impact on the emission intensity, and the intensity was only observed to decrease after the strains have exceeded 280% where the effects of reduced phosphor density and electrode conductivity begin to dominate.

Figure 7A:
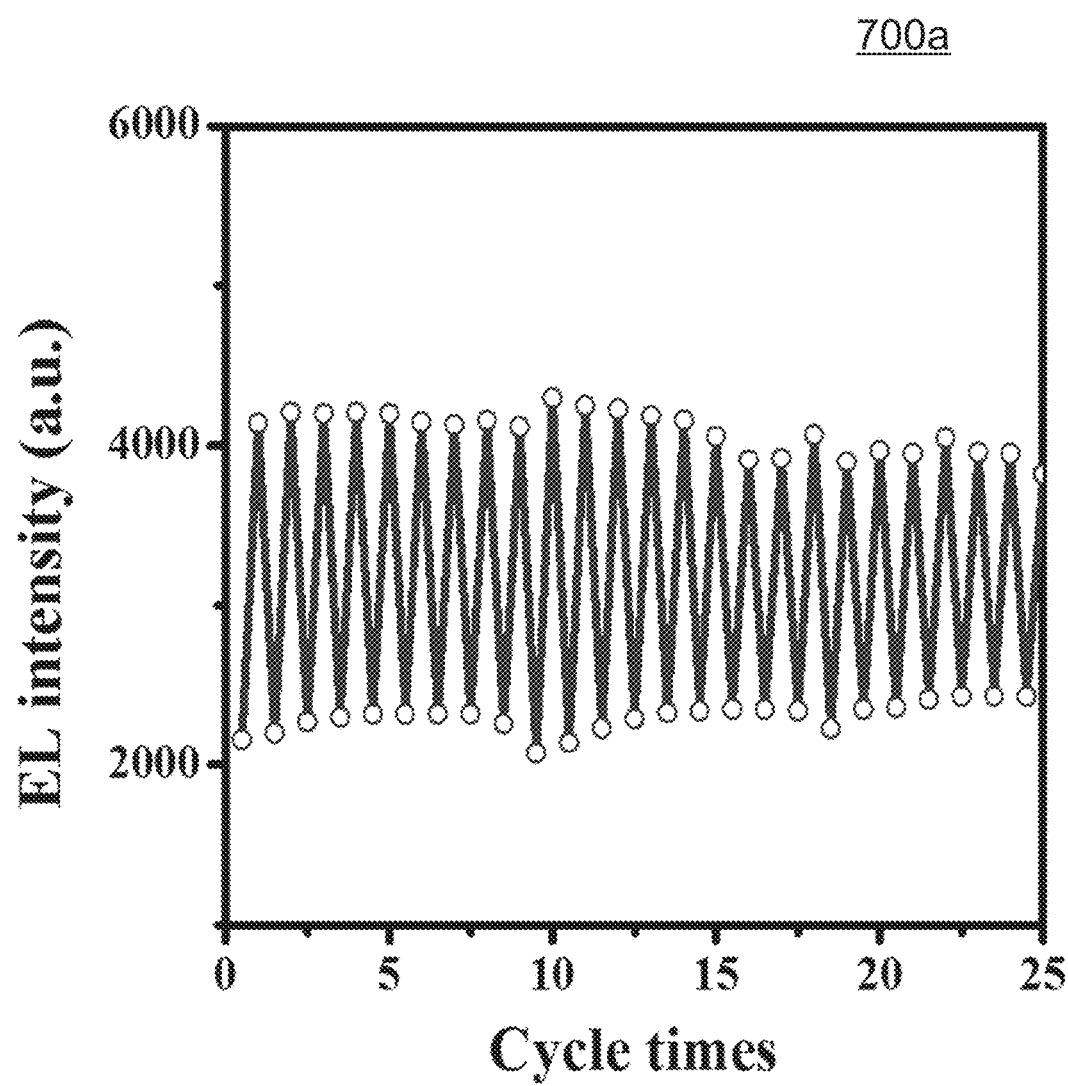
FIG. 7A is a plot of the electroluminescence intensity (arbitrary unit or a.u.) as a function of cycle time of the device according to various embodiments for 25 cycles.

The cycling stability of the stretchable EL device was also investigated. The highly stretchable ACEL device was stretched from about 40% to about 400%. As it requires a relatively long time (a couple of hours) for the highly strained device to fully recover to the initial state, the device was only allowed to relax at 40% to reduce the testing time. FIG. 7A is a plot 700a of the electroluminescence intensity (arbitrary unit or a.u.) as a function of cycle time of the device according to various embodiments for 25 cycles. FIG. 7A shows that the ratio $B_{400}/B_{40}$ varies from 1.66 to 2.01, where $B_{400}$ and $B_{40}$ are the brightness of the device under stretching strains of 400% and 40% respectively. The variation may be due to the mechanical hysteresis during the change of strain states in the highly strained polymer.

Figure 7B:
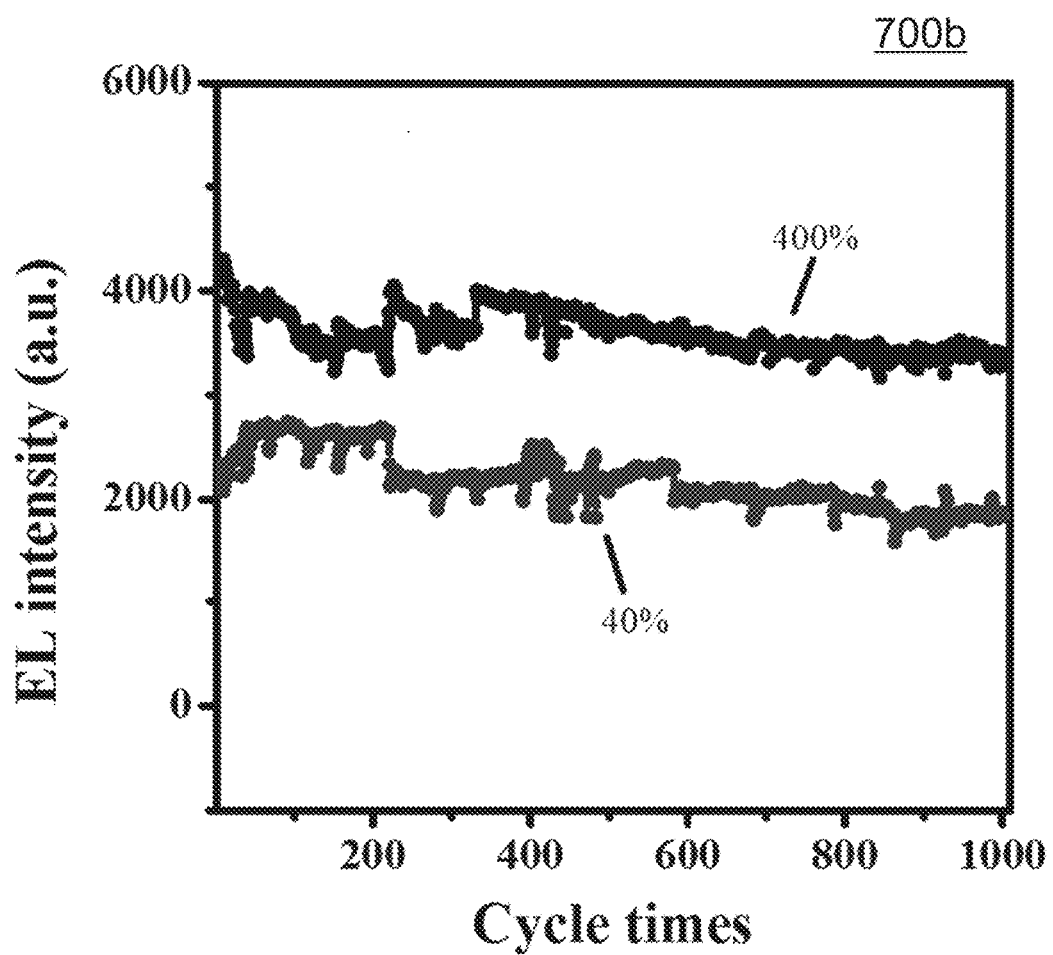
FIG. 7B is a plot of the electroluminescence intensity (arbitrary unit or a.u.) as a function of cycle time of the device according to various embodiments in 1000 cycles.

FIG. 7B is a plot 700b of the electroluminescence intensity (arbitrary unit or a.u.) as a function of cycle time of the device according to various embodiments in 1000 cycles. One device is stretched from between 0% to about 400% for 1000 cycles, while another device is stretched from between 0% to about 40% for 1000 cycles. FIG. 7B shows that performance of the device according to various embodiments may be quite stable compared to conventional stretchable EL devices. The emission intensity of the device is maintained at ~85% (of the emission intensity of the device at the beginning of the cycling test) after stretched to about 400% for 1000 cycles. Each cycle may involve stretching from 0% strain to a predetermined value (e.g. 40% or 400% strain) and back to 0% strain. Various embodiments may achieve an emission intensity, after being repeatedly stretched from between 0% to a value between 40% to 400% for 1000 cycles, above 80% of the original emission intensity. The emission fluctuation in the initial stretch-relaxation cycles was attributed to the contact problem between the electrode and ionic conductor layer during the measurement. The excellent mechanical compliance in the ACEL device has been shown to exceed conventional EL devices with stretchable emission components.

Figure 8A:
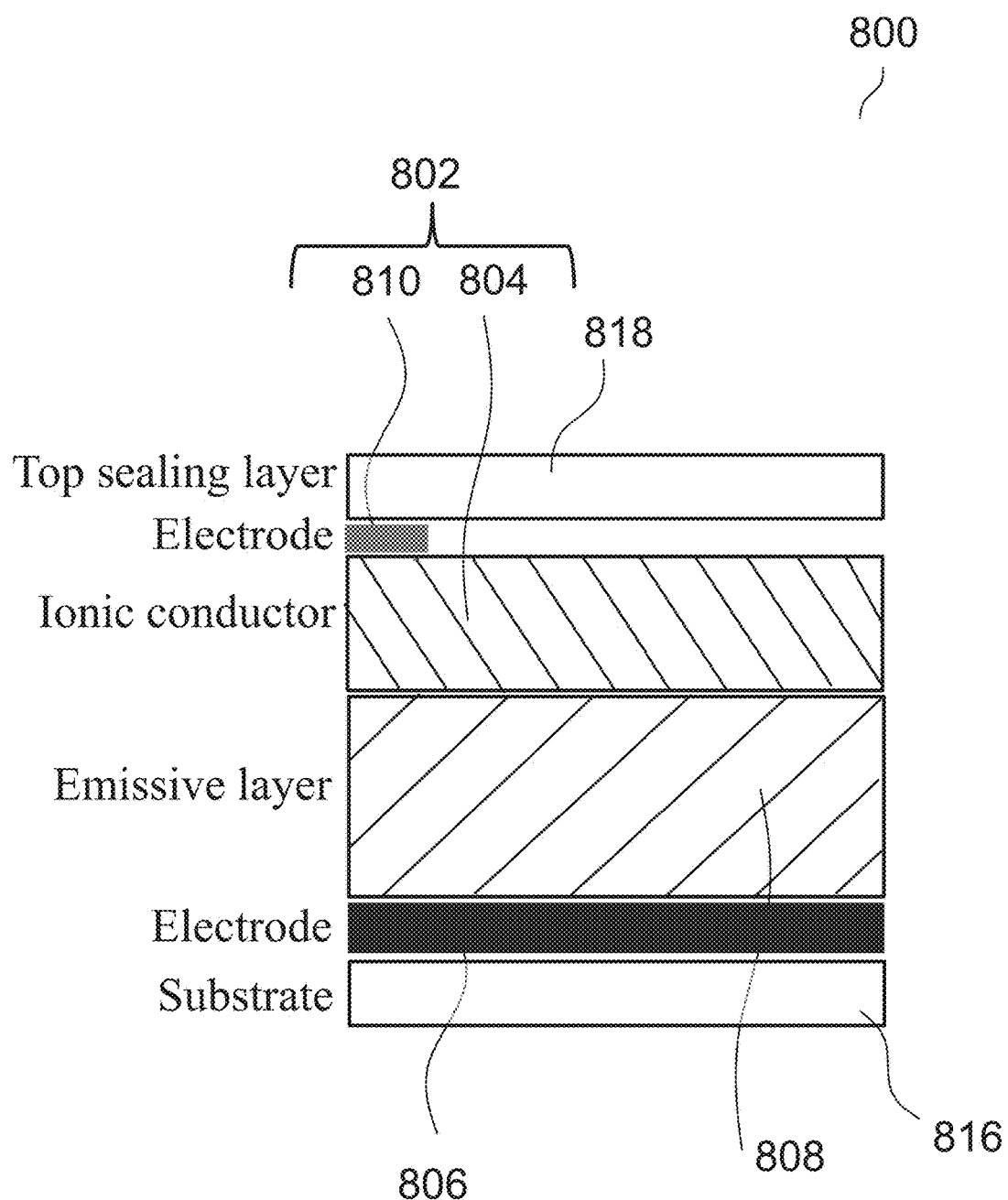
FIG. 8A is a schematic showing a device according to various embodiments.

FIG. 8A is a schematic showing a device 800 according to various embodiments. The device 800 may include a first contact structure 802 including an ionic conductor layer 804 and an electrode 810, and a second contact structure 806 of a conductive material such as silver ink. The device 800 may further include an emission layer 808 (containing e.g. ZnS:Cu in PDMS) between the first contact structure 802 and the second contact structure 806. The first surface of the emission layer 808 may be in contact with the first contact structure 802 (i.e. the ionic conductor layer 804), and the second surface of the emission layer 808 (opposite the first surface) may be in contact with the second contact structure 806. The ionic conductor layer 804 may cover the entire first surface of the emission layer 808, and the silver ink may cover the entire second surface of the emission layer 808. The emission layer 808 may cover the entire surface of the silver ink so as to prevent direct contact between the ionic conductor layer 804 and the silver ink.

The emission layer 808, the first contact structure 802 and the second contact structure 806 may be over a substrate 816, The device 800 may also include a sealing layer 818 over the emission layer 808, the first contact structure 802 and the second contact structure 806. The emission layer 808, the first contact structure 802 and the second contact structure 806, and the sealing layer 818 may form a vertical stacked arrangement.

The ionic conductor layer 804 and the silver ink may allow the device to exhibit good stretchability and/or deformity. The ionic conductor layer 804 may also exhibit good transmittance of optical light.

The ionic conductor solution may be easily deposited using extrusion approaches, allowing fully-printable ACEL devices to be achieved. Conventional transparent electrode materials such as indium tin oxide (ITO), silver nanowire (AgNW), carbon nanotube (CNT), graphene or metal mesh may require complicated deposition techniques and/or rigorous deposition conditions, making fully printable electroluminescent devices difficult to achieve. In various embodiments, all the functional layers, i.e. the first contact structure 802, the emission layer 808, and the second contact structure 806 may be printed by a customized three dimensional (3D) printer, i.e. a printer for printing three dimensional (3D) objects. The development of ionic conductor as transparent electrodes for ACEL devices may address the shortcomings of conventional electrode materials.

Figure 8B:
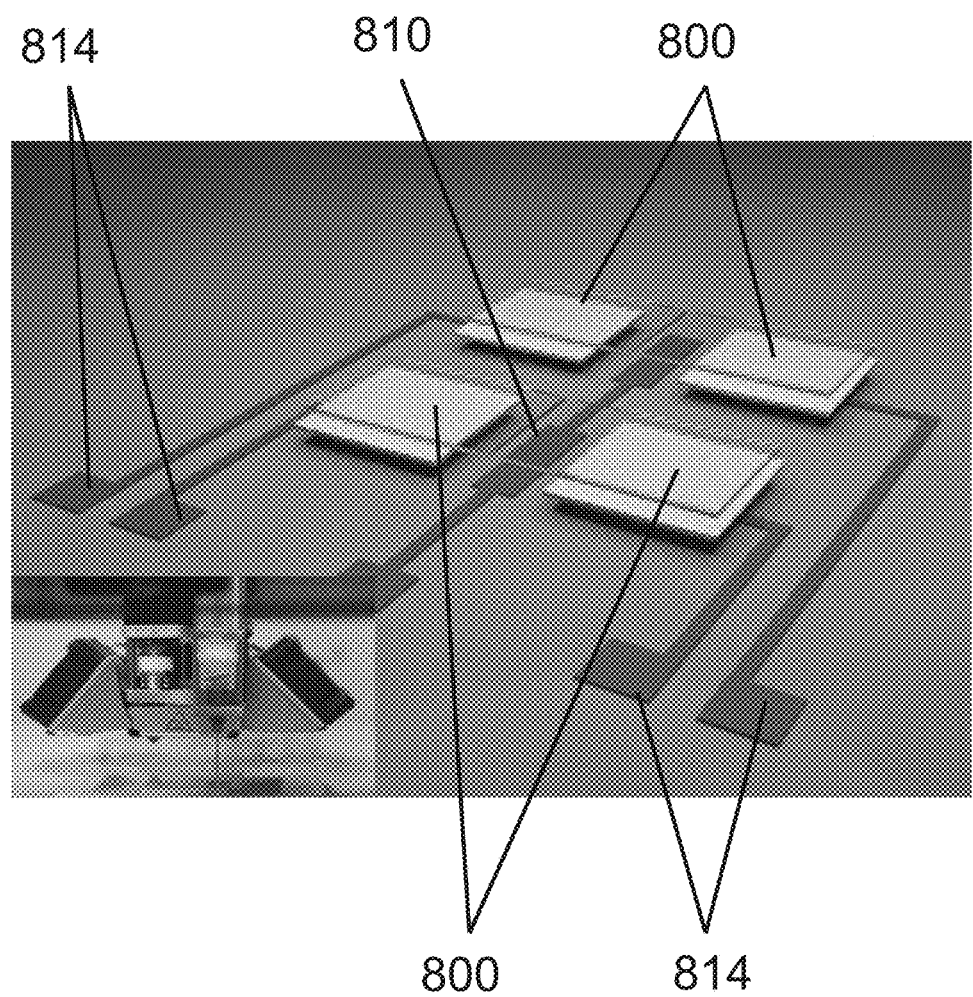
FIG. 8B is a schematic showing an array of electroluminescent devices according to various embodiments.

FIG. 8B is a schematic showing an array of electroluminescent devices 800 according to various embodiments. The devices 800 are printed by a three dimensional printer. FIG. 8B also shows that electrode 810 is printed to connect to the ionic conductor layer, and electrodes 814 are printed to connect to the silver ink layer. The inset of FIG. 8B shows a three dimensional (3D) printer head for fabricating the devices 800 according to various embodiments. The array of devices 800 may be designed as shown in FIG. 8B. The 3D structural design may then be converted into G-code, which is a programming language for 3D printer. The ACEL devices 800 are the printed using the customized 3D printer.

The second contact structure 806 including the silver ink layer, the emission layer 808, and the first contact structure 802 may be printed in sequence. In other words, the second contact structure 806 may be formed first, followed by the emission layer 808. The first contact structure 802 may be formed after forming the emission layer 808.

Figure 8C:
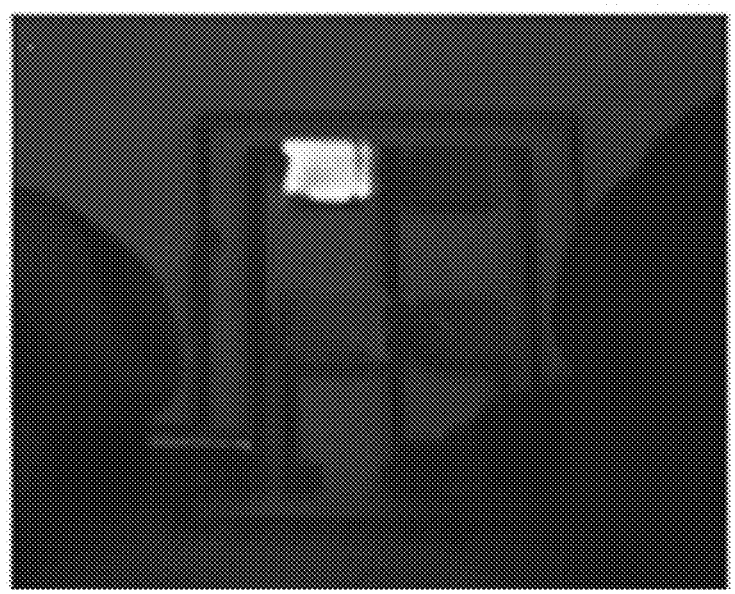
Figure 8D:
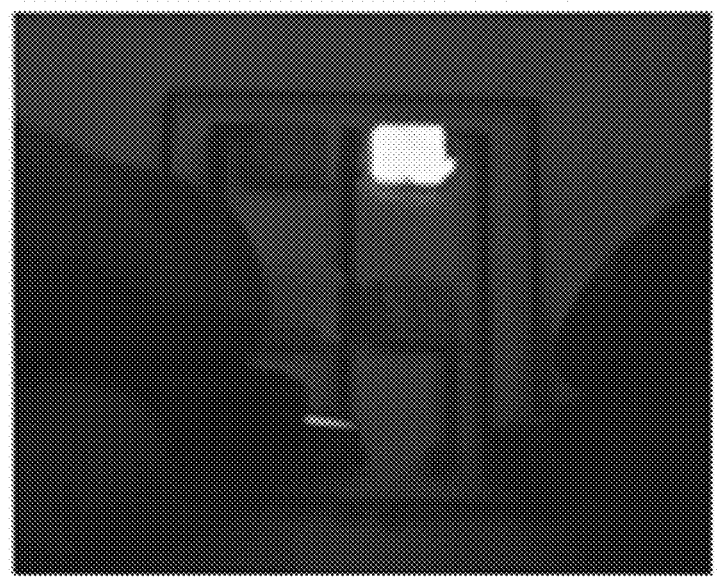
Figure 8E:
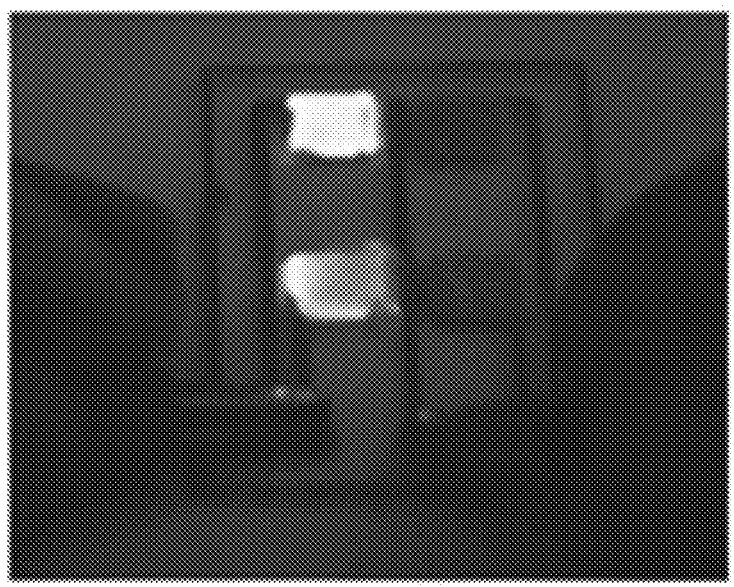

FIG. 8C shows a photo 850 showing the array in operation with one of the devices 800 according to various embodiments being turned on. FIG. 8D shows a photo 860 showing the array in operation with another one of the devices 800 according to various embodiments being turned on. FIG. 8E shows a photo 870 showing the array in operation with two of the devices 800 according to various embodiments being turned on.

Each device 800 may form a pixel. Accordingly, each pixel may be controlled and turned on independently. With the establishment of enabling technology, customized EL arrays may be formed, leading to new possibilities for additive manufacturing of EL structures.

Various embodiments may include ionic conductor layers as electrodes. The ionic conductors may possess extremely high stretchability and/or improved optical transmittance compared to the conventional electronic electrodes. The ionic conductors may be prepared with simple blending processes and may be easily deposited onto arbitrary substrates with different methods such as spin-coating, screen printing and inject printing etc. The ionic conductors may benefit all types of electroluminescent devices, including both the conventional rigid and planar type of devices, as well as the new emerging "soft" type of devices.

With the use of the highly stretchable ionic conductor, an embodiment of the highly stretchable ACEL device with a stretchability record of 700% has been demonstrated. An embodiment of the stretchable ACEL device has also been observed to show an unique emission behaviour, with greater emission intensity with increasing strain at smaller stretching strains below 280%, and lower emission intensity with increasing strain at larger tensile strains. The brightness of the embodiment of the device at 700% strain may still be maintained at about 70% of the initial emission intensity at 0% strain. Various embodiments of the ACEL device may also possess improved mechanical stability, and may be repetitively stretched to 400% with fairly stable performance maintained in the device. Various embodiments may provide new opportunities in stretchable lightings, volumetric 3D displays, interactive readout systems and/or other unprecedented applications.

EXAMPLES

Preparation of Ionic Conductor

As an example, poly(methyl methacrylate) (PMMA), lithium percolate (LiClO$_4$), propylene carbonate (PC) and acetonitrile were used to prepare an ionic conductor. LiClO$_4$ may first be dissolved in PC with the weight ratio of LiClO$_4$ to PC ranging between 1:20 to 1:2. After the LiClO$_4$ was fully dissolved, acetonitrile may be mixed with the solution with the weight ratio of acetonitrile to PC ranging between 1:2 to 5:1. PMMA may be slowly added to the blended solution with the weight ratio of PMMA to PC ranging between 1:2 to 5:1. The solution may be stirred between about 500 to about 2000 revolutions per minute (rpm) overnight to obtain a viscous and clear gel-like solution after the PMMA has been fully dissolved.

Fabrication of ACEL Device with Ionic Conductors

The ionic gel-like solution as prepared above may be deposited onto a 3M VHB tape (of thickness between about 0.1 mm to about 2 mm) via doctor-blade coating with the thickness of the deposited gel varying between about 50 μm and about 500 μm. The ionic conductor film may also be assembled via a layer-by-layer technique to achieve a smaller thickness of between about 1 μm and about 10 μm.

The ionic conductor gel-like solution may then be dried in an oven for 6 hours at about 60° C. to allow the acetonitrile to fully evaporate for forming a solid ionic conductor layer for formation of the subsequent layer.

As highlighted above, both propylene carbonate and acetonitrile may be used as solvents to prepare the ionic conductor solution. Evaporation of the acetonitrile in the bottom electrode may be required for the subsequent forming of the emission layer. The gel-like solution may be undesirable as it may not provide sufficient support for the emission layer. Acetonitrile may prevent curing of the emission layer.

An elastic polymer matrix may be used for the emission layer to allow for stretchability. As an example, Ecoflex 00-50 may be used as the polymer matrix. The silicone elastomer may be prepared with 1 part Ecoflex 00-50 A and 1 part Ecoflex 00-50 B. The ACEL materials, i.e. the electroluminescent elements, may be embedded in the elastic polymer matrix. As an example, ZnS:Cu micro-particles may be mixed with the Ecoflex solution in the weight ratio of the micro-particles to the Ecoflex solution ranging between 1:2 to 3:1. The prepared ZnS:Cu/Ecoflex composite may then be coated on the ionic conductor layer by doctor-blade coating with the thickness controlled between about 50 μm to about 500 μm. The composite may be allowed to cure under room temperature for 2 hours. Another ionic gel layer, i.e. another ionic conductor layer, with thickness of between about 50 μm to about 500 μm may be subsequently coated as the top electrode. Copper tape or graphite paper may be used to electrically connect the ionic conductor layers with the external power source. A VHB tape with the thickness of between about 0.1 mm to about 2 mm may be laminated on top to seal the device structure and complete the device fabrication.

Device Characterization

The transmittance spectra was measured by a Shimadzu spectrometer (UV-2501pc). The capacitance and resistance of the ionic conductor layers was measured by an Agilent E4980A precision LCR meter. Stretching tests of the samples were performed on a home-made motorized linear translation stage in room temperature. A functional generator (Yokogawa FG 300), which was connected to a power amplifier (Trek PZD 2000), was used to apply alternating voltage to the electroluminescent devices. Emission from the device was collected by an optical fiber connected to an Acton SP-2300 monochromator. The emission spectra from the devices were measured by a Princeton Pixis 100B spectroscopy charge-coupled device (CCD) detector in the monochromator. Luminance of the devices was measured by a Konica CS-200 spectroradiometer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An electroluminescent device comprising:
    a first contact structure, the first contact structure comprising an ionic conductor layer and an electrode in contact with the ionic conductor layer;
    a second contact structure; and
    an emission layer between the first contact structure and the second contact structure; wherein:
        the emission layer is configured to emit light when an alternating voltage is applied between the first contact structure and the second contact structure;
        the emission layer comprises an elastomer and one or more electroluminescent elements embedded in the elastomer;
        the electrode of the first contact structure and the ionic conductor layer form an interface having a capacitive value higher than a capacitive value of the emission layer; and
        the emission layer is in contact with ionic conductor layer.

2. The electroluminescent device according to claim 1, wherein the ionic conductor layer comprises an ionic entity and a polymer host.

3. The electroluminescent device according to claim 1, wherein the second contact structure comprises an electrode.

4. The electroluminescent device according to claim 1, wherein the second contact structure comprises:
    a further ionic conductor layer; and an electrode in contact with the further ionic conductor layer.

5. The electroluminescent device according to claim 4, wherein the further ionic conductor layer comprises an ionic entity and a polymer host.

6. The electroluminescent device according to claim 4, wherein the electrode of the second contact structure and the further ionic conductor layer form an interface having a capacitive value higher than a capacitive value of the emission layer.

7. The electroluminescent device according to claim 1, wherein the one or more electroluminescent elements are inorganic compounds.

8. The electroluminescent device according to claim 1, wherein the one or more electroluminescent elements are electroluminescent conjugated polymers.

9. The electroluminescent device according to claim 1, wherein the one or more electroluminescent elements are ionic transition metal complexes.

10. The electroluminescent device according to claim 1, wherein the ionic conductor layer is configured to at least partially allow light emitted by the emission layer to pass through.

11. The electroluminescent device according to claim 1, wherein a dimension of the electroluminescent device is stretchable beyond 100% of an original dimension of the electroluminescent device.

12. The electroluminescent device according to claim 11, wherein the dimension of the electroluminescent device is stretchable up to a limit of 700% of the original dimension of the electroluminescent device.

13. The electroluminescent device according to claim 1, wherein the elastomer is selected from a group consisting of a polysiloxane, a polyepoxide, a polysulfide rubber, a polyurethane, a polyacrylic, a silicone, and any combination thereof.

14. The electroluminescent device according to claim 1, wherein the elastomer is polydimethylsiloxane (PDMS).

15. The electroluminescent device according to claim 1, wherein a cross-sectional area of the ionic conductor layer in a first plane is greater than a cross-sectional area of the electrode of the first contact structure in a second plane, the first plane and the second plane being parallel to the interface formed by the electrode of the first contact structure and the ionic conductor layer.

16. A method of forming an electroluminescent device, the method comprising:

forming a first contact structure, the first contact structure comprising an ionic conductor layer and a first electrode in contact with the ionic conductor layer;

forming a second contact structure; and forming an emission layer between the first contact structure and the second contact structure; wherein:

the emission layer is configured to emit light when an alternating voltage is applied between the first contact structure and the second contact structure;

the emission layer comprises an elastomer and one or more electroluminescent elements embedded in the elastomer;

the first electrode and the ionic conductor layer form an interface having a capacitive value higher than a capacitive value of the emission layer; and the emission layer is in contact with ionic conductor layer.

17. The method according to claim 16, wherein the ionic conductor layer is formed before forming the emission layer on the ionic conductor layer.

18. The method according to claim 16, further comprising:

forming a further ionic conductor layer on the emission layer.

19. The method according to claim 18, further comprising:

forming a second electrode so that the second electrode is in contact with the further ionic conductor layer.

20. The method according to claim 16, wherein the first contact structure, the second contact structure, and the emission layer are formed at least partially by three-dimensional (3D) printing.

21. The method according to claim 16, wherein the elastomer is selected from a group consisting of a polysiloxane, a polyepoxide, a polysulfide rubber, a polyurethane, a polyacrylic, a silicone, and any combination thereof.

22. The method according to claim 16, wherein the elastomer is polydimethylsiloxane (PDMS).

23. The method according to claim 16, wherein a cross-sectional area of the ionic conductor layer in a first plane is greater than a cross-sectional area of the electrode of the first contact structure in a second plane, the first plane and the second plane being parallel to the interface formed by the first electrode of the first contact structure and the ionic conductor layer.

* * * * *